US010312903B2

(12) United States Patent
Abesingha et al.

(10) Patent No.: US 10,312,903 B2
(45) Date of Patent: Jun. 4, 2019

(54) TIMING CONTROLLER FOR DEAD-TIME CONTROL

(71) Applicant: pSemi Corporation, San Diego, CA (US)

(72) Inventors: Buddhika Abesingha, Escondido, CA (US); Merlin Green, San Diego, CA (US); Gary Chunshien Wu, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/011,362

(22) Filed: Jun. 18, 2018

(65) Prior Publication Data

US 2019/0140635 A1    May 9, 2019

Related U.S. Application Data

(63) Continuation-in-part of application No. 15/627,196, filed on Jun. 19, 2017, now Pat. No. 10,116,297.

(51) Int. Cl.
    *H03K 17/284* (2006.01)
    *H02M 1/38* (2007.01)
    (Continued)

(52) U.S. Cl.
    CPC ............ *H03K 17/284* (2013.01); *H02M 1/38* (2013.01); *H03K 17/0822* (2013.01); *G05F 1/00* (2013.01); *H02M 3/158* (2013.01); *Y02B 70/1466* (2013.01)

(58) Field of Classification Search
    CPC ........... H03K 3/356104; H03K 17/102; H03K 17/689; H03K 19/017509; H01L 27/1203;
    (Continued)

(56) References Cited

U.S. PATENT DOCUMENTS 5,416,043 A    5/1995 Burgener et al.
5,600,169 A    2/1997 Burgener et al.
(Continued)

FOREIGN PATENT DOCUMENTS

WO    2009126930    10/2009
WO    2018236771    12/2018

OTHER PUBLICATIONS

Mesic, Mate, International Search Report and Written Opinion received from th EPO dated Nov. 30, 2018 for appln. No. PCT/US2018/038123, 26 pgs.
(Continued)

*Primary Examiner* — Yemane Mehari
(74) *Attorney, Agent, or Firm* — Jaquez Land Greenhaus LLP; Martin J. Jaquez, Esq.; Alessandro Steinfl, Esq.

(57) ABSTRACT

Systems, methods, and apparatus for use in biasing and driving high voltage semiconductor devices using only low voltage transistors are described. The apparatus and method are adapted to control multiple high voltage semiconductor devices to enable high voltage power control, such as power amplifiers, power management and conversion (e.g. DC/DC) and other applications wherein a first voltage is large compared to the maximum voltage handling of the low voltage control transistors. According to an aspect, timing control of edges of a control signal to the high voltage semiconductor devices is provided by a basic edge delay circuit that includes a transistor, a current source and a capacitor. An inverter can be selectively coupled, via a switch, to an input and/or an output of the basic edge delay circuit to allow for timing control of a rising edge or a falling edge of the control signal.

23 Claims, 32 Drawing Sheets

(51) Int. Cl.
*H03K 17/082* (2006.01)
*H02M 3/158* (2006.01)
*G05F 1/00* (2006.01)

(58) Field of Classification Search
CPC .............. H01L 29/1095; H01L 27/088; H02M 3/156–158; H02M 3/1584; H02M 3/1588; H02M 3/07; H02M 2001/0032; H02M 2001/0045; G05F 1/00
USPC ................................................. 323/271–285
See application file for complete search history.

(56) References Cited

U.S. PATENT DOCUMENTS

| | | | | |
|---|---|---|---|---|
| 8,593,128 | B2* | 11/2013 | Burns | H03K 17/102 323/224 |
| 9,024,700 | B2 | 5/2015 | Ranta | |
| 9,484,897 | B2 | 11/2016 | Green et al. | |
| 10,109,537 | B2 | 10/2018 | Moffat et al. | |
| 10,116,297 | B1* | 10/2018 | Wu | H03K 17/102 |
| 2004/0135606 | A1 | 7/2004 | Takahashi et al. | |
| 2004/0217794 | A1 | 11/2004 | Strysko | |
| 2007/0159150 | A1* | 7/2007 | Hosokawa | H02M 3/1588 323/285 |
| 2009/0206817 | A1 | 8/2009 | Ng et al. | |
| 2013/0314065 | A1* | 11/2013 | Jian | G05F 1/46 323/284 |
| 2014/0169038 | A1* | 6/2014 | Kamath | H03D 3/00 363/16 |
| 2016/0164413 | A1* | 6/2016 | Akiyama | H03K 17/04206 323/271 |
| 2016/0277012 | A1 | 9/2016 | Abesingha et al. | |
| 2017/0170177 | A1 | 6/2017 | Tasbas et al. | |

OTHER PUBLICATIONS

Mehari, Yemane, Office Action received from the USPTO dated Mar. 14, 2018 for U.S. Appl. No. 15/627,196, 12 pgs.

Mehari, Yemane, Notice of Allowance received from the USPTO dated Aug. 10, 2018 for U.S. Appl. No. 15/627,196, 9 pgs.

Wu, Gary, Response filed in the USPTO dated May 11, 2018 for U.S. Appl. No. 15/627,196, 3 pgs.

Reginelli, Francesca, Invitation to Pay Additional Fees and, Where Applicable, Protest Fee received from the EPO dated Sep. 14, 2018 for appln. No. PCT/US2018/038123, 18 pgs.

* cited by examiner

*Prior Art*

*Prior Art*

*Prior Art*

*Prior Art*

1800A

1800B

1800C

TIMING CONTROLLER FOR DEAD-TIME CONTROL

CROSS REFERENCE TO RELATED APPLICATIONS

The present application is a continuation in part of U.S. patent application Ser. No. 15/627,196, filed on Jun. 19, 2017 and entitled "DC-Coupled High-Voltage Level Shifter", the disclosure of which is incorporated herein by reference in its entirety.

The present application may be related to U.S. Pat. No. 9,484,897, issued on Nov. 1, 2016 and entitled "Level Shifter", the disclosure of which is incorporated herein by reference in its entirety. The present application may be related to U.S. Pat. No. 5,416,043, issued on May 6, 1995 and entitled "Minimum charge FET fabricated on an ultrathin silicon on sapphire wafer", the disclosure of which is incorporated herein by reference in its entirety. The present application may also be related to U.S. Pat. No. 5,600,169, issued on Feb. 4, 1997 and entitled "Minimum charge FET fabricated on an ultrathin silicon on sapphire wafer", the disclosure of which is incorporated herein by reference in its entirety. The present application may also be related to U.S. patent application Ser. No. 14/964,412, filed on Dec. 9, 2015 and entitled "S-Contact for SOI", the disclosure of which is incorporated herein by reference in its entirety. The present application may also be related to U.S. patent application Ser. No. 15/488,367, filed on Apr. 14, 2017 and entitled "S-Contact for SOI", the disclosure of which is incorporated herein by reference in its entirety. The present application may also be related to U.S. Pat. No. 9,024,700 B2, entitled "Method and Apparatus for Use in Digitally Tuning a Capacitor in an Integrated Circuit Device", issued May 5, 2015, the disclosure of which is incorporated herein by reference in its entirety.

TECHNICAL FIELD

Various embodiments described herein relate generally to systems, methods, and devices for use in biasing and driving high voltage semiconductor devices using only low breakdown voltage transistors.

BACKGROUND

In applications where high voltage semiconductor devices operating in high voltage conditions are controlled, high breakdown voltage transistors are typically used in corresponding control circuits. For example, in traditional gallium nitride (GaN) power management applications, transistors such as laterally diffused metal oxide semiconductor (LDMOS), bipolar or high voltage metal-oxide-semiconductor field-effect transistors (MOSFETs) can be utilized to control the GaN devices operating in high voltage conditions. Since these control transistors typically have poor figure of merit (FOM), compared to the FOM of the GaN devices, which can thereby, for example, limit the operating frequencies of the GaN devices, the overall circuit (e.g. power management) can be limited in performance by the large, high voltage control transistors which can be difficult to charge and discharge quickly (e.g. their FOM is too high) and therefore the benefit of using the GaN devices can be substantially reduced. In addition to power management applications, high voltage signals may be found in amplifiers such as audio amplifiers (especially Class-D audio amplifiers); filter banks; and drivers for resonant circuits; and any other application in which peak voltages may exceed the voltage handling capability of the control circuits being used to achieve the application.

This application applies to those circuits with high side (HS) and low side (LS) controls that either pull a common output node up to a high voltage or pull the output node down to a low voltage (often a reference voltage or ground). Such circuits require efficiency, low distortion, high speed, flexibility, reliability and low cost. The current application addresses these issues by addition of dead time control to the parent application.

In such applications where high voltage devices are controlled, it can be desirable to tightly control timing of the ON state of the high voltage devices, so as to, for example, reduce or eliminate overlap time of the high voltage devices in the ON state.

SUMMARY

According to a first aspect of the present disclosure, a timing control circuit configured to control timing of edges of an input square wave signal, the timing control circuit comprising: a first processing path comprising a first plurality of a same configurable edge delay circuit arranged in series connection, the first processing path configured to selectively delay one or both of a rising edge and a falling edge of the input square wave signal; and a second processing path comprising a second plurality of the configurable edge delay circuit arranged in series connection, the second processing path configured to selectively delay one or both of the rising edge and the falling edge of the input square wave signal independently from the first processing path; wherein the configurable edge delay circuit is configured to selectively provide an edge delay to one of the rising edge and the falling edge based on an ON or OFF state of an input switch of the configurable edge delay circuit, and wherein the edge delay is based on a charging time of one capacitor by a current source to reach a trip point voltage of an inverter.

According to a second aspect of the present disclosure, a circuital arrangement configured to provide timing information for control of a high side (HS) device and a low side (LS) device operating in a high voltage domain, the circuital arrangement comprising: a timing control circuit operating in a low voltage domain, configured to control timing of edges of an input square wave signal, the timing control circuit comprising: i) a first processing path to provide timing information of the HS device, comprising a first plurality of a same configurable edge delay circuit arranged in series connection, the first processing path configured to selectively delay one or both of a rising edge and a falling edge of the input square wave signal; and ii) a second processing path to provide timing information of the LS device, comprising a second plurality of the configurable edge delay circuit arranged in series connection, the second processing path configured to selectively delay one or both of the rising edge and the falling edge of the input square wave signal independently from the first processing path; wherein the configurable edge delay circuit is configured to selectively provide an edge delay to one of the rising edge and the falling edge based on an ON or OFF state of an input switch of the configurable edge delay circuit, wherein the edge delay is based on a charging time of one capacitor by a current source to reach a trip point voltage of an inverter, wherein all transistor devices of the timing control circuit are each configured to withstand a voltage substantially smaller than a high voltage of the high voltage domain.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
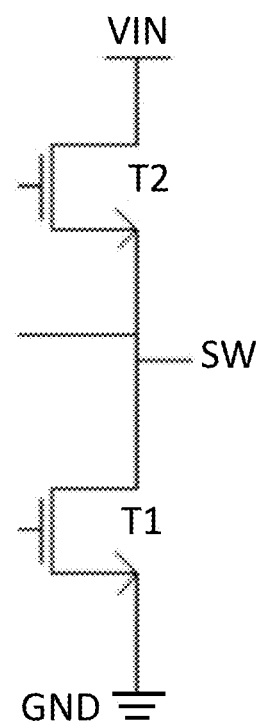
FIG. 1 shows two high voltage stacked transistors, a low side transistor, LS, T1, and a high side, HS, transistor T2.

As used in the present disclosure, the figure of merit (FOM) of a switching transistor (e.g. a transistor which can have a conducting ON state and a non-conducting OFF state), also simply noted as FOM, refers to the product of the ON resistance $R_{on}$ of the transistor and the gate charge $Q_g$ of the transistor. A lower FOM can be indicative of a higher switching performance of a transistor. Having a low FOM, especially at high withstand voltages, is a distinctive characteristic of GaN transistors, which are capable of handling up to 100 volts with a FOM approximately ten times lower than the FOM of a high voltage MOSFET.

As used in the present disclosure, a low voltage device or low voltage transistor refers to a semiconductor transistor device with a low breakdown voltage which can withstand and block (e.g. in the OFF state) DC voltages (e.g. typically applied between the source and drain terminals of the transistor, or any two of drain, source and gate terminals) less than 10 volts and more typically substantially less than 10 volts, such as less than 3.3-5 volts. Some exemplary low voltage devices are complementary metal-oxide-semiconductor (CMOS) transistors.

It can be desirable to use small, low breakdown voltage MOSFET transistors which can have figure of merits (FOMs), as measured, for example, by the product of the ON resistance $R_{on}$ of the transistor and the gate charge $C_g$ of the transistor, similar to or better (lower) than the FOM of high voltage transistors. Such MOSFETs can allow for best use of the GaN characteristics, thereby improving both performance and cost of the implementation.

It can also be desirable to allow regeneration (i.e. re-construction) of timing control information not only based on edges of a pulse signal, but also based on a DC level of the pulse signal, so to provide a more robust detection of the timing control information when compared to prior art implementations using non-galvanic coupling discussed above. This can allow regeneration of the timing control signal even in cases where an edge is not detected, due for example, to a switching event occurring during a detection phase of the edge, as the level of the pulse signal will be detected after the switching event. As described in the following paragraphs of the present disclosure, a coupling to the level shifter, according to various embodiments of the present disclosure can allow transmission of both edge information and DC level information of a pulse signal representative of the timing control information to the level shifter.

In addition, by implementing a single chip silicon on insulator (SOI) MOSFET solution based on low voltage MOSFETs, additional functionality can be included which addresses additional areas known to a person of ordinary skill in the art such as, but not limited to, GaN gate voltage overdrive protection, minimum gate drive requirements, dead time control, temperature stability, floating node tracking and startup voltage condition among others.

The present disclosure describes a level shifter circuit capable of driving control voltages or analog signals at relatively low voltages such as about 0 volts to 3.5/5 volts, while riding, or "flying," on top of high voltages substantially higher than the low voltages, such as 12-100 volts or higher. The level shifter according to the present disclosure uses low breakdown voltage transistors that operate with respect to a flying reference voltage (12-100 volts or higher).

The level shifter according to the present disclosure uses a parallel resistive-capacitive coupling to receive timing control information from a low voltage circuit operating with respect to a fixed reference voltage. The parallel resistive-capacitive coupling allows transmission of edge information and DC level information of a pulse signal representative of the timing control information from the low voltage circuit to the flying reference voltage. By receiving edge and DC level information, the level shifter according to the present disclosure can regenerate the pulse signal in its entirety and therefore control the high voltage semiconductor devices in a more robust and efficient manner. In particular, operation of the level shifter according to the present disclosure can be immune to a missed (undetected) edge of the pulse signal as control of the high voltage semiconductor devices in case of such missed edge may be provided based on DC level information of the pulse signal received by level shifter through the parallel resistive-capacitive coupling. This allows control of the high voltage semiconductor devices without missing a cycle (e.g. representative of ON/OFF states of the high voltage devices) for an increased protection and more efficient operation of the high voltage devices.

The various embodiments presented herein describe low voltage control of high voltages performed by the novel level shifter which enables proper control of high voltage devices using low (breakdown) voltage transistors of the level shifter, where the low breakdown voltage is substantially smaller than the high voltage, and where the control is based on edge information and DC level information of a pulse signal transmitted to the level shifter through the parallel resistive-capacitive coupling.

As used in the present disclosure, a high voltage device or high voltage transistor refers to a semiconductor transistor device which can withstand and block (e.g. in the OFF state) DC voltages (typically applied between the source and drain terminals of the transistor, or any two of drain, source and gate terminals) greater than 5-10 volts, and more typically substantially greater than 5-10 volts, such as greater than 12-100 volts. Some exemplary high voltage devices are depletion mode GaN transistors (d-GaN), enhancement mode GaN transistors (e-GaN), stacked MOS transistors, and other high-voltage transistors known to a person skilled in the art, such as Si MOSFETs, hexagonal shape FETs (HEXFETs), LDMOS, indium phosphide (InP), etc. which can also be enhancement or depletion modes (e.g. e-type or d-type) and N or P polarity.

In the present disclosure e-GaN FET transistors are used as exemplary high voltage devices in order to describe the various embodiments of the present application, and therefore such exemplary usage should not be construed as limiting the scope of the invention as disclosed herewith. Unless explicitly mentioned as d-GaN, the terms GaN and e-GaN are considered synonymous herein.

A person skilled in the art can recognize that depletion mode d-GaN devices or other types of high voltage transistors such as Si MOSFETs, HEXFETs, LDMOS, InP (and all these examples can be of the e-type or d-type; and N or P polarity) or virtually any device capable of switching ON or OFF with high voltages applied can be controlled using the parallel resistive-capacitive coupling in accordance with the teachings of the present disclosure. A person skilled in the art would know that specific design considerations in view of a desire to control a specific type of a high voltage transistor may also be needed, description of which is beyond the scope of the present disclosure.

E-GaN devices have typical threshold, or turn-on, voltages of approximately +0.7 to +3 volts of gate-to-source voltage. Such devices are typically capable of withstanding 5 to 200 volts of drain-to-source, $V_{DS}$, voltage, thereby enabling high voltage applications, such as, for example, DC/DC power conversion from a high input voltage to a low output voltage. GaN transistors are used in the present disclosure as an exemplary approach to high voltage power management due to the known advantageous characteristics of GaN transistors, such as, for example, a low FOM.

Throughout this description, embodiments and variations of the level shifter are described for the purpose of illustrating uses and implementations of the inventive concept. The illustrative description should be understood as presenting examples of the inventive concept, rather than as limiting the scope of the concept as disclosed herein.

The various embodiments of the present disclosure can be used in applications where efficient and robust control of high voltage devices is desirable using low voltage transistors. Although the exemplary case of DC/DC converters is used to describe the various embodiments of the level shifter according to the present disclosure, such exemplary case should not be construed as limiting the scope of the invention as disclosed herewith. The person skilled in the art is able to use the teachings according to the present disclosure and apply such teachings to specific applications where low voltage control of high voltages is desired. One example of other category of possible applications is in the area of class-D audio amplifiers.

FIG. 1 shows two stacked GaN transistors, T1 and T2, which can be used as a basis for high voltage stacked GaN transistors. As used in the present disclosure, transistors T1 and T2 can be referred to as, respectively, the low side (LS) transistor and the high side (HS) transistor, and any controlling element associated in controlling the LS transistor and the HS transistor can likewise be referred to as, respectively, the low side (LS) control and the high side (HS) control. In the present disclosure, DC/DC conversion serves as an exemplary application for control of stacked high voltage transistors whose teachings can be applied to other applications where stacked transistors control voltages larger than the inherent voltage handling capability of conventional control devices (e.g. using low voltage control transistors). A person skilled in the art will recognize that while the exemplary DC/DC converter using the stacked transistor of FIG. 1 relies on two stacked GaN FETs T1 and T2, the inventive control system disclosed herein can be applied to a stack height of one, as well as to larger stack heights of three, four, or any number of stacked transistors, and to any high voltage transistor made in other materials and/or fabrication processes.

Figure 2:
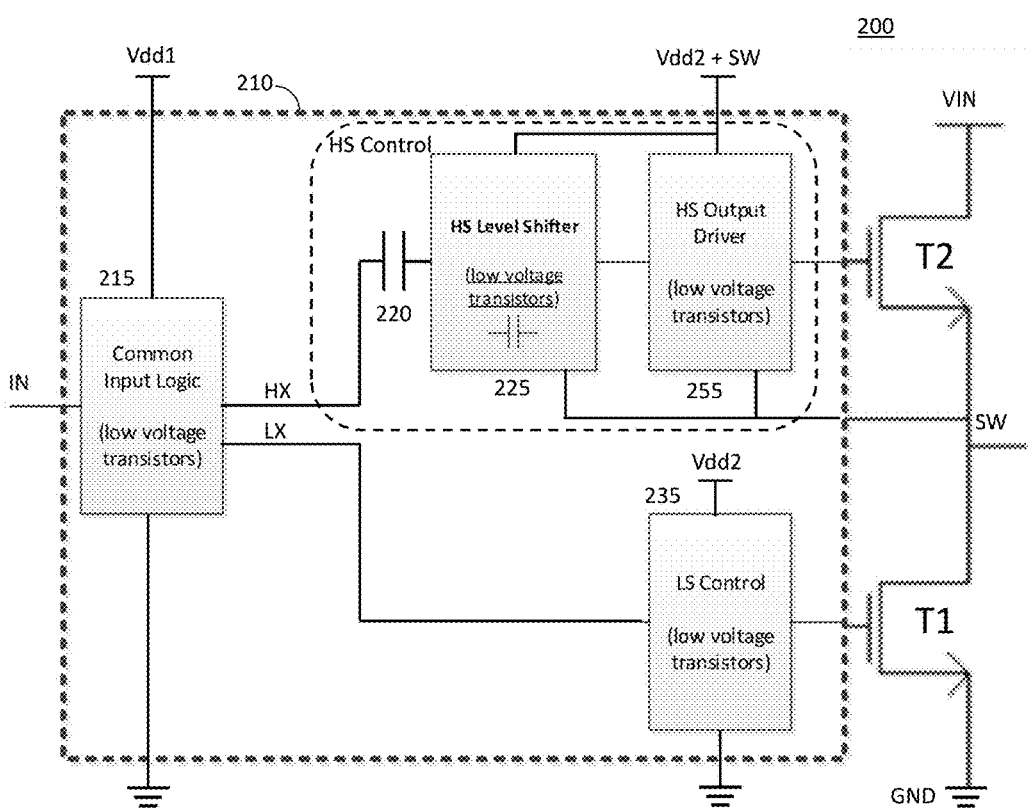
FIG. 2 shows a prior art embodiment of a gate driver circuit with a non-galvanic coupling (e.g. capacitive) used for controlling the high side of the high voltage stacked transistors of FIG. 1.

FIG. 2 shows a prior art embodiment of a gate driver circuit (210) used for controlling the stacked GaN transistors T1, T2 of FIG. 1 using (exclusively) low (breakdown) voltage transistors. Such prior art circuit depicted in FIG. 2 can be used for implementing, for example, a DC/DC converter. The input voltage, $V_{IN}$, shown in FIGS. 1 and 2, applied to the drain of the top transistor T2 (high side transistor) of the stack can be as high as the voltage handling capability of the chosen GaN transistors T1 and T2 (e.g. 12 volts-100 volts or higher). As known by a person skilled in the art, based on the input voltage $V_{IN}$, a lower voltage can be generated by controlling the length of time of the ON/OFF states of the two transistors. Such low voltage can be obtained, for example, by filtering a voltage at the common output node SW of the two transistors T1 and T2.

As can be seen in the prior art embodiment of FIG. 2, the source of the lower GaN transistor T1 is tied to a reference ground, GND, and the source of the upper GaN transistor T2 is tied to the drain of T1, which together create an output node SW.

The exemplary prior art circuit shown in FIG. 2 uses low (breakdown) voltage transistors to convert the high input voltage $V_{IN}$, to a lower voltage obtained via the output node SW. In one exemplary embodiment $V_{IN}$ can be 100 volts and the lower voltage obtained via node SW (e.g. via filtering of voltage at node SW) can be about 0 volts (e.g. 100 mV). In addition to being able to handle high voltage, it is important for the DC/DC converter of FIG. 2 to exhibit high efficiency in making such a conversion and also doing so at a high frequency. The person skilled in the art readily understands the concept of efficiency in a power conversion application, as well as the desired high frequency conversion which enables use of smaller inductive components in a filter (not shown in FIG. 2) associated to the output node SW. GaN devices provide high efficiency due to their low Ron, as discussed above, while simultaneously switching at high speed due to their low Cg.

By using low voltage transistors throughout the control circuitry, such as, for example, MOSFETs, low cost, high precision and high volume CMOS manufacturing techniques can provide the necessary control circuit (e.g. gate driver 210 of FIG. 2) while keeping the performance advantages provided by the high voltage GaN FET transistors (T1, T2), thereby eliminating the need for more exotic, high voltage transistors in the control circuit. Such low voltage MOSFETs (e.g. SOI MOSFETs) in the control circuit can also enable single chip embodiments where additional control or signal processing capabilities can be integrated within a same monolithically integrated chip. The person skilled in art can appreciate such integration, as single chip devices (e.g. monolithic integration) typically offer the most reproducible, reliable and lowest cost solutions possible in the electronics arts.

The gate driver circuit (210) of the prior art embodiment depicted in FIG. 2 controls the switching of the LS transistor and the HS transistor of the high voltage stacked transistors depicted in FIG. 1 between their respective ON and OFF states to provide a desired voltage, based on the input voltage $V_{IN}$, at node SW. The gate driver circuit (210) controls the switching of the LS transistor T1 and the HS transistor T2 by providing the gate voltages needed to turn ON or OFF each of the two transistors T1 and T2, typically in an alternating fashion, where only one of the two transistors can be ON (or OFF) at any one time. Such gate voltages can be obtained via a feedback loop (not shown) between a filtered voltage based on the voltage at node SW and the input terminal IN to the gate driver circuit (210). The person skilled in the art readily knows that a pulse width modulator (PWM) controlled by the filtered voltage (e.g. at node SW) can be used in such feedback loop to provide low voltage control timing pulses to the gate driver circuit (210). Such low voltage timing pulses can be fed to the common input logic block (215) of the driver circuit (210) of FIG. 2, and subsequently conditioned and fed to the HS level shifter (225) and the LS control block (235), both including low (breakdown) voltage transistors.

With continued reference to FIG. 2, the HS level shifter (225) converts the low voltage timing pulses to a voltage level adequate to control the gate-to-source voltage of the HS transistor T2 of the high voltage stacked transistors of FIG. 1 even as its source node, SW, rises and falls between $V_{IN}$ and GND. As can be seen in FIG. 2, coupling between the input logic block (215) operating with respect to a fixed reference voltage (e.g. GND) and the HS level shifter operating with respect to a flying reference voltage (SW) is achieved by way of a capacitive coupling (220). The HS control circuit (225, 255) operates with respect to a flying reference voltage that is the switching voltage (SW) at the output node of the DC/DC converter depicted in FIG. 2.

In a typical implementation and upon a power up sequence, the gate driver circuit (210) of the prior art embodiment depicted in FIG. 2 can initially turn off either the high side transistor (T2) or both the high side and the low side transistors (T1, T2) to ensure that both T1 and T2 are in a safe OFF state while all other DC/DC converter associated circuitry stabilizes upon the power-up. Subsequently, the gate driver (210) can control a DC voltage conversion (e.g. $V_{IN}$ to SW) by initially turning on the low side (LS) transistor T1 by driving its gate voltage above its threshold voltage while turning OFF the high side (HS) transistor T2. This brings the voltage at node SW to GND since T1 is conducting and therefore its $V_{DS}$ can be very close to zero. Also, since the source of T2 is close to GND, the HS transistor T2 holds off all of the $V_{IN}$ voltage applied to its drain (e.g. its $V_{DS}=V_{IN}$).

Alternatively, when the gate driver (210) of the prior art embodiment depicted in FIG. 2 turns OFF LS transistor T1 and turns ON the HS transistor T2 of FIG. 2, the output node SW is charged high toward the voltage $V_{IN}$. Since the HS transistor T2 is conducting and the LS transistor T1 is not conducting, during the ON period (e.g. length of time of ON state) of the HS transistor T2, the output node SW will have a nominal voltage equal to $V_{IN}$, other than during a corresponding charging and discharging period at the beginning and end of the ON period. During the ON period of T2, the gate voltage of HS transistor T2 stays positive (e.g. by a voltage equal to Vdd2 as provided by the Vdd2+SW supply to the HS transistor T2 controlling blocks (225, 255)) with respect to the voltage at the output node SW such as to keep the HS transistor T2 ON and conducting strongly (e.g. Vdd2≥$V_{th}$ of T2, where Vth is the threshold voltage of HS transistor T2), thereby keeping the voltage at node SW at $V_{IN}$. A person skilled in the art will recognize that the capacitive coupling (220) drops the $V_{IN}$ high voltage which can therefore avoid impressing of such high voltage upon the low voltage transistors of the HS control circuits (225, 255) of the gate driver (210) depicted in FIG. 2.

Figure 3A:
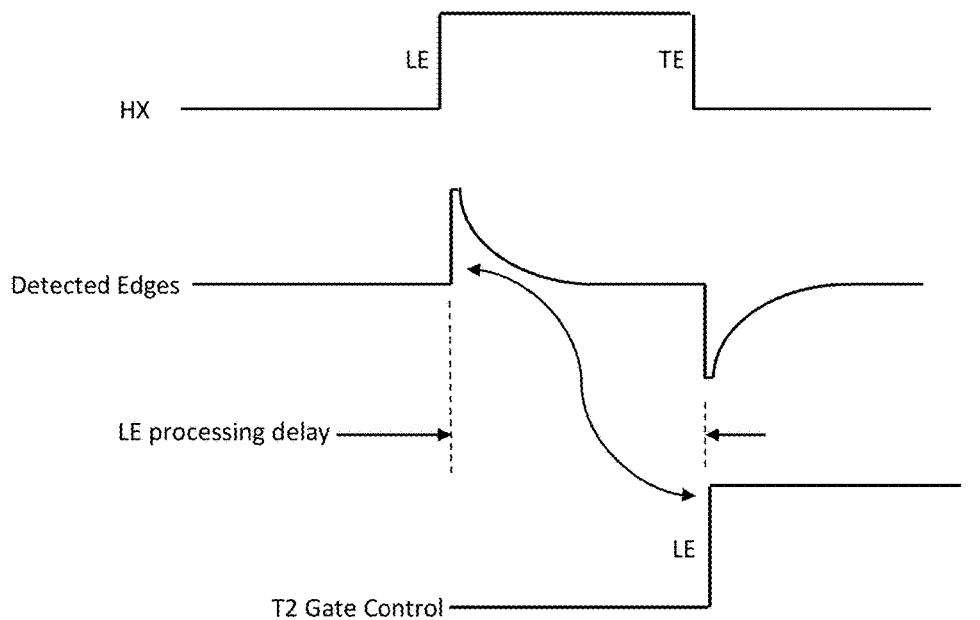
FIG. 3A shows a timing diagram representative of a processing of a pulse signal HX by the prior art embodiment of the gate driver circuit shown in FIG. 2 where a processing delay of an edge of the HX signal is substantially equal to a pulse width of the pulse signal HX.
Figure 3A:
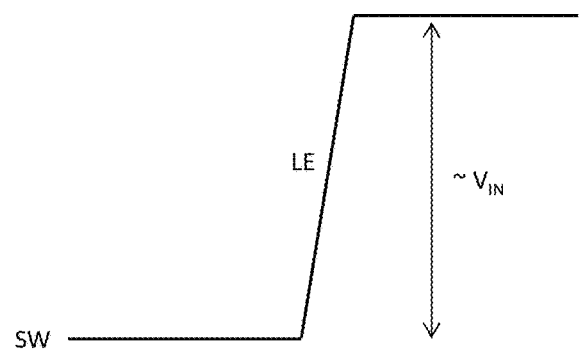

As discussed above, the capacitive coupling (220) to the HS level shifter (225) depicted in FIG. 2 only allows transmission of edge information of a pulse signal HX representative of the timing control information provided at the input terminal IN of the gate driver circuit (210). FIG. 3A shows a timing diagram representative of a processing of the pulse signal HX where a leading edge LE and a trailing edge TE of the pulse signal HX are shown. An edge detection circuit within the HS level shifter (225) detects the LE and TE edges and generates a corresponding signal, Detected Edges signal. The Detected Edges signal is passed to a processing circuit that generates therefrom a gate control pulse, T2 Gate Control, at a voltage appropriate to control ON/OFF state of the HS transistor T2. Due to delays in the processing circuit, the generated T2 Gate Control signal may have edges that are delayed with respect to edges of the Detected Edges signal as shown in FIG. 3A, where the processing delay, LE Processing Delay, of the detected LE edge is shown.

Figure 3B:
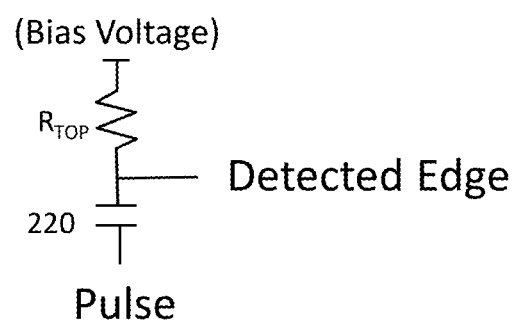
FIG. 3B shows an edge detection circuit used for processing of the pulse signal HX by the prior art embodiment of the gate driver circuit shown in FIG. 2. Also, shown in FIG. 3B, are input pulse voltage signal to the edge detection circuit and a detected edge voltage signal by the edge detection circuit.
Figure 3B:
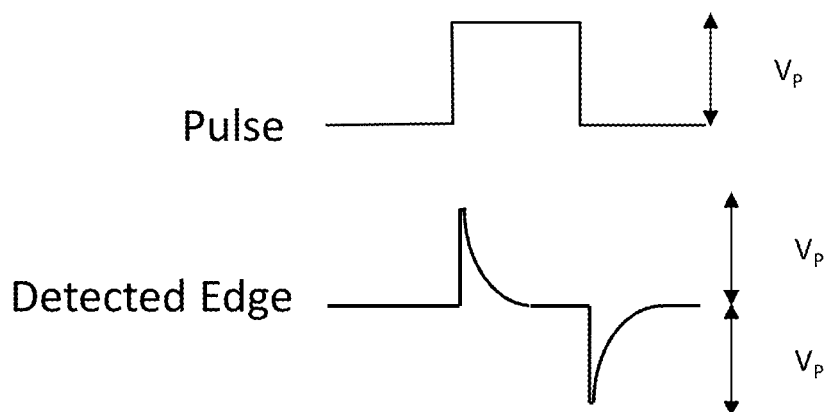

As shown in FIG. 3B, the edge detection circuit typically includes a resistor $R_{TOP}$ that is in series connection with the capacitive coupling (220) at the input. The resistor $R_{TOP}$ is used to set a DC voltage bias level (Bias Voltage) at an input of the edge detection circuit that follows. The capacitive coupling (220) and the resistor $R_{TOP}$, therefore establish a change of voltage level based on a received edge of the pulse signal (e.g. HX) as shown in FIG. 3B. The subsequent edge detection circuit then converts the edge information into logic and timing information to control the HS transistor T2. Due to a delay within the processing circuit, the leading edge LE of the gate control pulse may be delayed by an amount close to a pulse duration of the pulse signal HX, and therefore a high voltage switching event at the node SW may occur concurrently with an edge detection of the trailing edge TE of the pulse signal HX. Such concurrency of the high voltage switching event with the detection of the trailing edge TE may in turn negatively affect the detection circuit in a way to cause the trailing edge TE not being detected, and therefore potentially corrupt the gate control pulse that controls the HS transistor T2. Such corruption may induce a lengthened ON state of the HS transistor T2 that overlaps an ON state of the LS transistor T1 thereby causing shoot through currents though the stacked transistors T1, T2. A person skilled in the art is well aware of ill effects associated to the shoot through current, such as, for example, reduction in efficiency of the DC converter, potential risk of damage to the transistors (T1, T2) being driven, and potential risk of damage to a power supply generating the $V_{IN}$ voltage due to increased stress.

Although the timing diagram depicted in FIG. 3A shows a potential edge detection issue with respect to a trailing edge (TE) of the pulse signal HX, a person skilled in the art would realize that same issue may be present in detection of either the trailing or leading edges of the pulse signal HX with similar ill effects as described above.

Figure 3C:
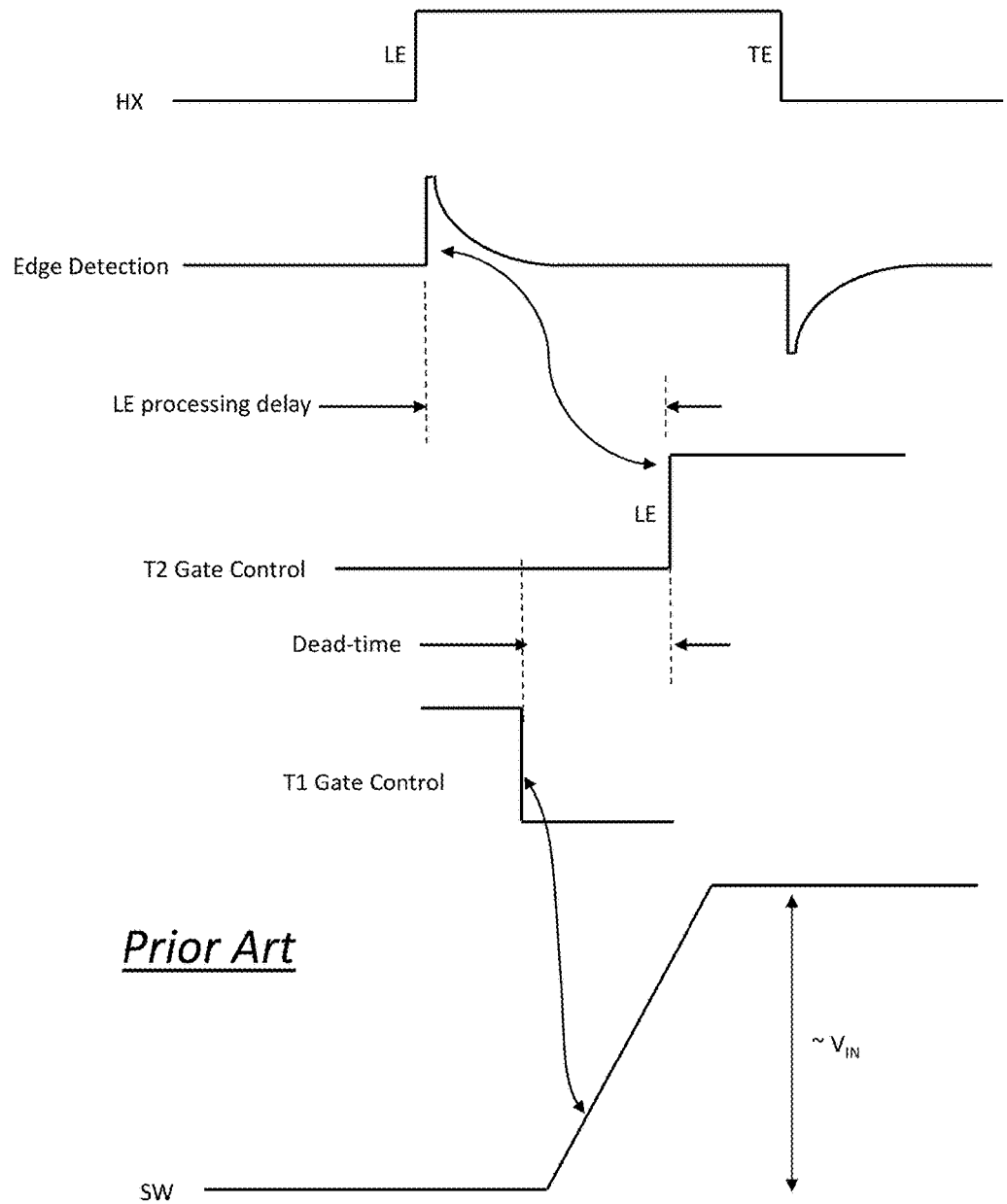
FIG. 3C shows a timing diagram representative of a processing of a pulse signal HX by the prior art embodiment of the gate driver circuit shown in FIG. 2 where a processing delay of an edge of the HX signal is substantially equal to a dead-time length between ON states of the LS and HS transistors T1, T2.

As shown in the timing diagram of FIG. 3C, edge detection issues may also arise when the node SW switches from a low voltage to a high voltage immediately after the LS transistor T1 is switched OFF. In this case, a negative inductor current induced by an inductor, part of a filter coupled to the SW node, drives the voltage at the node SW towards the high voltage, causing a switching event. Assuming a dead-time that separates the ON state of the HS transistor T2 and the ON state of LS transistor T1 is roughly equal to the edge processing delay of the leading edge LE of the HX signal, then detection of the LE edge of the HX signal may occur concurrently with the switching event. It should be noted that the timing diagrams depicted in FIGS. 3A and 3C are merely to help understand possible edge detection issues in the capacitively coupled HS level shifter of the prior art in view of vicinity of a switching event to an edge detection event without necessarily showing to scale signal levels and timings, including rising and falling slopes of the depicted signals.

Based on the above potential issues with the prior art capacitively coupled HS level shifter, mainly due to being limited to receive only edge information of a pulse signal representative of timing control information, embodiments according to the present disclosure provide an HS level shifter capable of receiving and processing edge information as well as DC level information of the pulse signal. This allows regeneration of the pulse signal in the high voltage domain within which the HS level shifter operates in spite of a missed edge. If a switching event is concurrent with an edge detection phase in a way to cause a missed edge, the HS level shifter according to the present disclosure can respond to the DC level information and generate an appropriate HS gate control signal, therefore maintaining proper functionality of the DC/DC converter.

Figure 4:
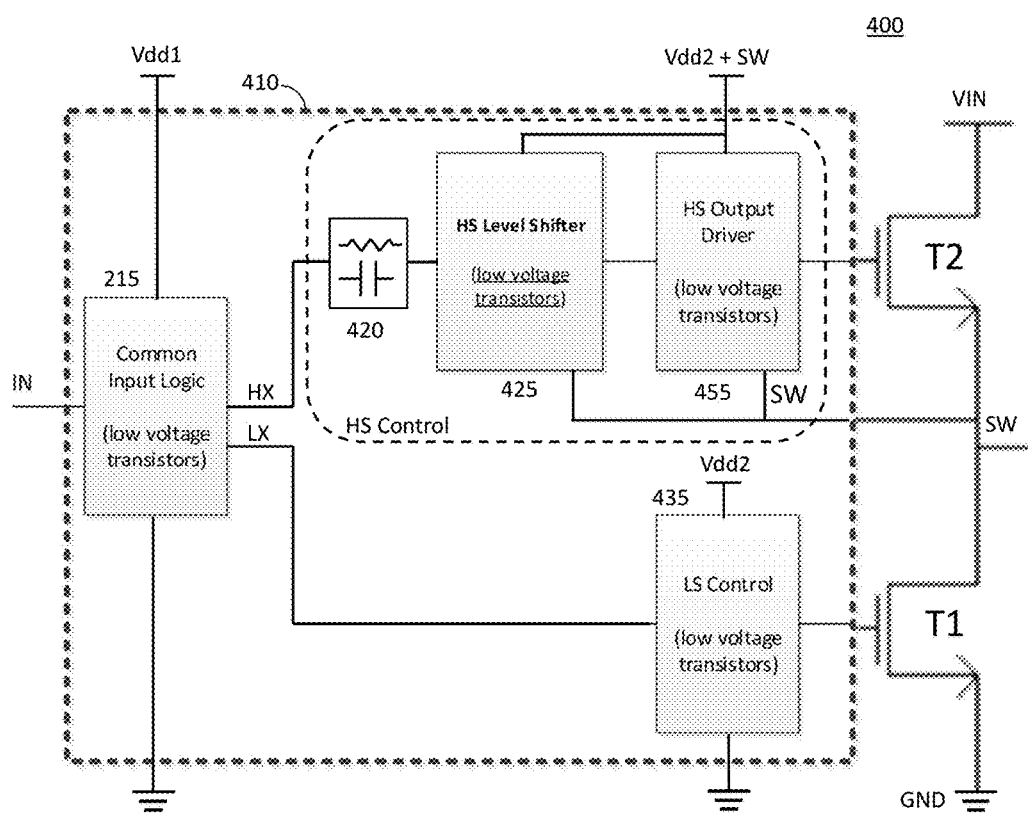
FIG. 4 shows a block diagram of a gate driver circuit according to an embodiment of the present disclosure which can be used to control the low side and the high side of the high voltage stacked transistors of FIG. 1.

FIG. 4 shows a block diagram of a gate driver circuit (410) according to an embodiment of the present disclosure which can be used to control the LS transistor T1 and the HS transistor T2 of the high voltage stacked GaN transistors of FIG. 1. In contrast to the prior art gate driver circuit (210) of FIG. 2 where a capacitive coupling (220) is used to transmit edge information to the HS level shifter (225) and drop the high voltage $V_{IN}$, the gate driver (410) according to the present disclosure uses a parallel resistive-capacitive coupling to transmit both edge and DC level information the HS level shifter (425) while dropping the high voltage $V_{IN}$.

As can be seen in FIG. 4, pulse signal HX, representative of the timing control information provided at the input terminal IN of the gate driver circuit (410) and generated by the common input logic block (215) operating in the first (static) voltage domain (GND, Vdd1), is transmitted, through the parallel resistive-capacitive coupling (420), to the HS level shifter (425) operating in the second (flying) voltage domain (SW, Vdd2+SW). The gate driver circuit (410) according to the present disclosure, via its HS control circuit (420, 425, 455) and LS control circuit (435), therefore maintains advantages provided by using exclusively low voltage transistors while eliminating potential issues associated with the prior art capacitive coupling configuration discussed above with respect to FIG. 2. As used in the present disclosure, a "parallel resistive-capacitive" coupling or network, such as, for example, the parallel resistive-capacitive coupling (420) of FIGS. 4, 5A, 5C, 6A, 6B, 7, and 9A, the parallel resistive-capacitive network ($R_{TOP}$, $C_{TOP}$) of FIGS. 6A, 6B, 7, and 9A, and the parallel resistive-capacitive network ($R_{BIAS}$, $C_{BIAS}$) of FIGS. 6A, 6B, 7, and 9A, according to the present teachings comprises at least one parallel resistor-capacitor network that comprises a network of one or more series connected resistors in a parallel connection with a network of one or more series connected capacitors. The network of one or more series connected resistors and the network of one or more series connected capacitors may be coupled to one another via at least two common nodes that define the parallel connection.

As shown in FIG. 4, a pulse signal LX, which may be a complementary signal to the HX input signal and representative of the same timing control information, is provided to the LS control circuit (435) to generate a gate control pulse at a voltage appropriate to control ON/OFF state of the LS transistor T1. According to an embodiment of the present disclosure, the LS control circuit (435) may be similar (e.g. same) to the combination circuits (425, 455) used to control the HS transistor T2 so to provide a processing time delay of the LX signal through the LS control circuit (435) that is substantially equal to one provided to the HX signal through the HS control circuit (420, 425, 455). Further implementation details of the LS control circuit (435) may therefore be omitted.

Figure 5A:
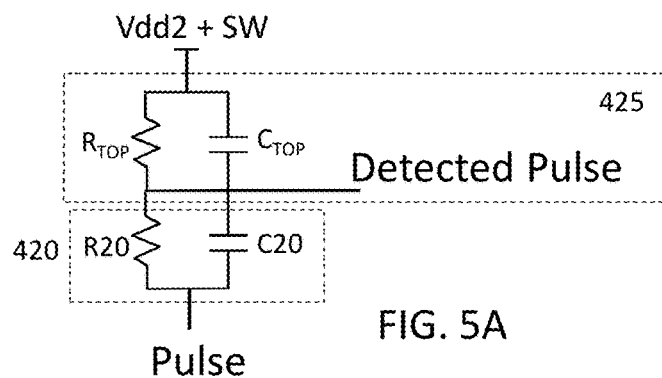
FIG. 5A shows a pulse detection circuit used for processing of the pulse signal HX by the gate driver circuit of FIG. 4 comprising a parallel resistive-capacitive coupling.

FIG. 5A shows an exemplary embodiment according to the present disclosure of the parallel resistive-capacitive coupling (420), comprising a resistor R20 in parallel connection with a capacitor C20 which are used to transmit edge information and DC level information of the input pulse signal, Pulse. The fast response time of the capacitor C20 transmits accurate edge information of the pulse signal Pulse to the HS level shifter (425), while the resistor R20 provides a transmission path for the DC level information of the pulse signal to the HS level shifter (425). As noted above, the capacitor C20 is used to drop the high voltage $V_{IN}$ and therefore allows safe operation of the low voltage transistors of the HS level shifter (425). In addition, the resistor R20 drops the high voltage Vin and therefore also allows safe operation of the low voltage transistors of the HS level shifter, 425.

The parallel resistive-capacitive coupling (420) is complemented by a parallel resistive-capacitive network comprising a resistor $R_{TOP}$ and a capacitor $C_{TOP}$ that are also connected in parallel, having a first common node coupled to the flying supply Vdd2+SW and a second common node coupled to a common node of the resistive capacitive coupling (420) where a detected pulse is provided.

Figure 5B:
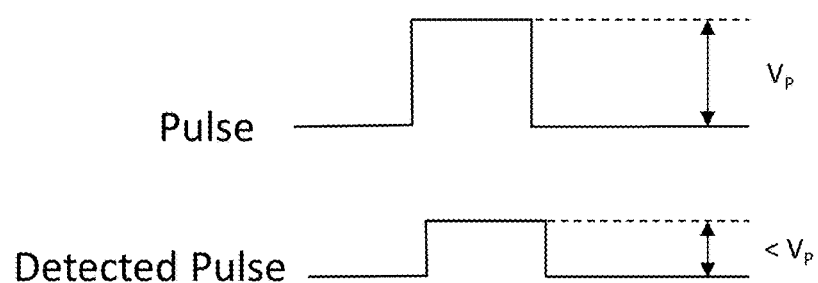
FIG. 5B shows an input pulse voltage signal to the pulse detection circuit of FIG. 5A and a detected pulse voltage signal by said edge detection circuit.

With continued reference to the parallel resistive-capacitive coupling according to the present disclosure depicted in FIG. 5A, a person skilled in the art would realize that the coupling between the parallel resistive-capacitive coupling (420) and the parallel resistive-capacitive network ($R_{TOP}$, $C_{TOP}$) forms a capacitive voltage divider (C20, $C_{TOP}$) that establishes a transient (dynamic) voltage response for generation of edges of the detected pulse, and a resistive voltage divider (R20, $R_{TOP}$) that establishes a static voltage response for generation a DC level of the detected pulse. According to an embodiment of the present disclosure a capacitance ratio of $C_{TOP}$/C20 can be inversely proportional, or approximately inversely proportional, to a resistance ratio of $R_{TOP}$/R20 so that to provide a smooth transition between the transient and the static responses, thereby generating a detected pulse similar in shape to the input pulse (as shown in FIG. 5B) with a reduced amplitude (difference between low and high voltage levels).

Figure 5C:
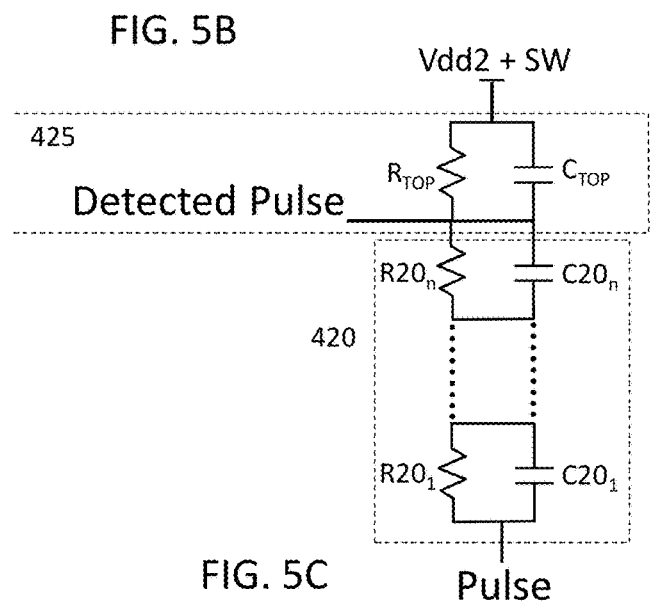
FIG. 5C shows an exemplary implementation of the pulse detection circuit of FIG. 5A where the parallel resistive-capacitive coupling comprises series connected resistors and series connected capacitors.

A person skilled in the art would realize that monolithic integration of the gate driver (410) of FIG. 4, including the parallel resistive-capacitive coupling (420), may set limits on a withstand voltage of the capacitor C20. It may therefore be desirable to replace the single capacitor (C20) with a plurality of series connected capacitors so as to allow a higher combined withstand voltage in an integrated configuration, as shown in FIG. 5C. In the configuration depicted in FIG. 5C, total capacitance of the series connected capacitors (C20$_1$, C20$_2$, ..., C20$_n$) can be made according to the value of the capacitor C20 described above with reference to FIG. 5A. Also, the total resistance of the series connected resistors (R20$_1$, R20$_2$, ..., R20$_n$) can be made according to the value of the resistor R20. A person skilled in the art would realize that other parallel resistive-capacitive coupling configurations based on the configurations depicted in FIG. 5A and FIG. 5B are also possible, where a capacitive coupling is used to establish a transient voltage response to regenerate edges of a detected pulse and a resistive coupling is used to establish a static voltage response to regenerate a DC level of the detected pulse. As used herein, "equivalent capacitance" of the parallel resistive-capacitive coupling (420) refers to the total capacitance of the series connected capacitors (C20$_1$, C20$_2$, ..., C20$_n$) and may be represented by a single capacitor C20 having the equivalent capacitance, as depicted in FIG. 5A.

With further reference to FIG. 5C, it should be noted that although numbers of the series elements of R20$_i$ and C20$_i$ may be different and yet provide a functionally working configuration. However, in some embodiments, for robustness and reliability concerns, "floating" intermediate nodes of the series connected capacitors C20$_i$ may not be desired. If there is a capacitive node that is not connected to a resistor, the DC voltage at such capacitive node would be dependent on a very small and highly variable leakage current of an associated capacitor. Such leakage current may in turn contribute to mismatched voltage drops across the capacitors C20$_i$ where, for example, one capacitor may have a large drop and another capacitor may have a smaller drop. The voltage rating of the capacitor should therefore be considered in view of the large drop in voltage.

With continued reference to FIG. 5C, a person skilled in the art would understand that since the capacitor C20 drops the voltage $V_{IN}$, or a voltage substantially equal to $V_{IN}$, the capacitance ratio $C_{TOP}$/C20 should be large enough, and therefore the resistance ratio R20/$R_{TOP}$ should also be large enough to keep the absolute voltage of the detected pulse, Detected Pulse, between the flying voltage domain (SW, Vdd2+SW) under all operating conditions. For example, with reference to FIG. 5A, if SW node switches from 0 volts to 100 volts, and Vdd2 is equal to 5 volts, then the capacitance ratio $C_{TOP}/C20$ should be greater than 105/5=21. The following Table A shows the amplitude (voltage) of the detected pulse signal, Detected Pulse, for a case where the capacitance ratio $C_{TOP}/C20$ is equal to 21, SW node switches from 0 volts to 100 volts, and Vdd2 is equal to 5 volts.

TABLE A

| Input Pulse voltage | SW node voltage | Detected Pulse voltage |
|---|---|---|
| 0 volts | 0 volts | 4.762 volts |
| 5 volts | 0 volts | 5 volts |
| 0 volts | 100 volts | 100 volts |
| 5 volts | 100 volts | 100.238 volts |

The HS level shifter according to the present disclosure is able to accurately process low amplitude pulse signals while operating within the flying voltage domain (SW, Vdd2+SW). As shown in the table representing the above example, the absolute voltage of the Detected Pulse is exactly kept between the flying voltage domain (SW and Vdd2+SW) with no margin. In practice, some voltage headroom is needed away from the supply rails which means that the actual $C_{TOP}/C20$ ratio would be larger than 21 in order to bring the Detected Pulse voltage higher than 100 volts when SW is at 100 volts. An additional bias circuit may be needed to bring the Detected Pulse voltage lower than 5 volts when SW is at 0 volts which will be described later. Another advantage of the HS level shifter according to the present disclosure is its ability to accurately process the low amplitude pulse signals in presence of high slew rates of the flying reference voltage SW, which according to an exemplary case can switch from 0 volts to 100 volts.

Figure 6A:
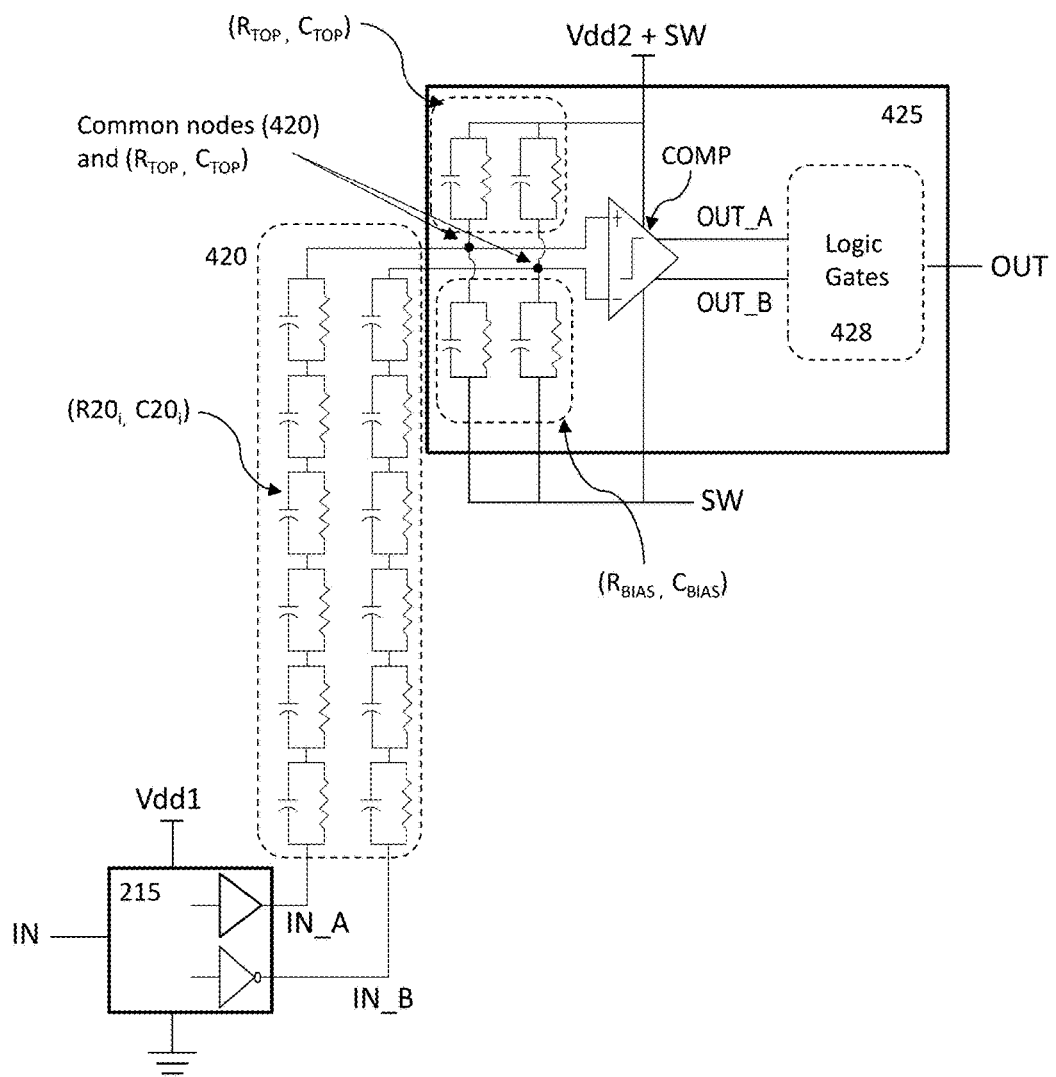
FIG. 6A shows an embodiment according to the present disclosure of the HS level shifter with the parallel resistive-capacitive coupling shown in FIG. 4. In such embodiment, a flying comparator comprising exclusively low voltage transistors is used.

FIG. 6A shows an embodiment according to the present disclosure of a HS level shifter (425) with the parallel resistive-capacitive coupling (420) described above, where a flying comparator, COMP, comprising exclusively low voltage transistors, is used to accurately process the low amplitude pulse signals regenerated through the combination of the parallel resistive-capacitive coupling (420) and associated parallel resistive-capacitive network ($R_{TOP}$, $C_{TOP}$). As used herein, the expression "flying comparator" refers to a comparator operating in a flying voltage domain, such as the flying voltage domain defined by switching voltages (SW, Vdd2+SW), where SW can switch from 0 volts to 100 volts, and vice versa, and comprising exclusively low breakdown voltage transistors. A person skilled in the art would appreciate benefits provided by such flying comparator which can allow added precision (e.g. timing) and flexibility (e.g. wide range of output duty cycle with short length pulses) in the control of the high voltage semiconductor devices (T1, T2). Further implementation details of the flying comparator, COMP, according to the present disclosure is provided in the following paragraphs.

According to an embodiment of the present disclosure, the flying comparator COMP can be provided with a differential signal obtained by transmitting complementary input pulses (IN_A, IN_B) through respective parallel resistive-capacitive couplings (420), as depicted in FIG. 6A. The complementary input pulses (IN_A, IN_B) may be obtained via processing of the input signal provided at the input terminal IN of the gate driver (410) depicted in FIG. 4, in which case the input signal HX=(IN_A, IN_B). Alternatively, the input signal HX may be a single signal and generation of the complementary input pulses (IN_A, IN_B) may be provided within a separate circuit (not shown). The flying comparator COMP outputs complementary output signals (OUT_A, OUT_B) with amplitude levels large enough for subsequent processing by low break down transistors based logic gates (428) of the HS level shifter (425).

As can be seen in FIG. 6A, each of the input pulses (IN_A, IN_B) is transmitted through a respective parallel resistive-capacitive coupling (420) which is coupled to a respective parallel resistive-capacitive network ($R_{TOP}$, $C_{TOP}$). Therefore, each such input pulse is subjected to a same processing as described in relation to FIGS. 5A, 5B, 5C discussed above. As can be seen in FIG. 6A, common nodes between each parallel resistive-capacitive coupling (420) and the respective parallel resistive-capacitive network ($R_{TOP}$, $C_{TOP}$) are connected to the positive/negative inputs (also referred to as non-inverting/inverting inputs) of the flying comparator COMP. It should be noted that the input pulses (IN_A, IN_B) being generated in the static voltage domain (GND, Vdd1) may operate between a low voltage level (e.g. 0 volts) and a high (rail) voltage level (e.g. Vdd1). According to one exemplary embodiment Vdd1 can be in a range of 2.5 volts to 5 volts. According to an exemplary embodiment, Vdd2 can be in a range of 2.5 volts to 5 volts and the switching voltage at node SW can switch between 0 volts to 100 volts. It should be noted that such exemplary voltages should not be considered as limiting the scope of the present disclosure, as a person skilled in the art would know how to select different voltages based on established design goals and parameters. For example, the switching voltage at node SW may be switching to any high voltage that is greater than 12 volts, and equivalent capacitance C20 of a corresponding parallel resistive-capacitive coupling (420) may be adjusted accordingly, if necessary.

A person skilled in the art readily knows that an input stage of a comparator, such as the flying comparator COMP of FIG. 6A, may operate over a certain range of common mode voltage of its differential input signal. A person skilled in the art readily knows that the common mode voltage is the DC voltage level of an input signal to the comparator relative to the reference voltage (e.g. voltage at node SW). Therefore, for proper operation of the flying comparator COMP, the common mode voltage of the differential input to the flying comparator COMP, as provided by the common nodes between the parallel resistive-capacitive coupling (420) and the parallel resistive-capacitive network ($R_{TOP}$, $C_{TOP}$), should remain within an acceptable operational voltage range of the flying comparator COMP irrespective of a switching level of the flying voltage domain (SW, Vdd2+SW).

It follows that according to an embodiment of the present disclosure, the capacitance ratio $C_{TOP}/C20$ and the resistance ratio $R_{TOP}/R20$ are configured to provide detected pulses, based on the input pulses (IN_A, IN_B), to the positive/negative inputs of the flying comparator COMP, with voltage levels that are within the acceptable operational voltage range of the flying comparator COMP. As ratios also affect the amplitude of the differential input signal to the flying comparator, according to some exemplary embodiments of the present disclosure, such ratios may be configured to provide common mode voltage levels of the input differential signal that are within the acceptable operational voltage range of the flying comparator while providing as large an amplitude of the differential input signal to the flying comparator as possible. A person skilled in the art would recognize that selecting the ratios based on the high voltage level of the flying voltage domain (SW, Vdd2+SW), e.g. (100 volts, 105 volts), would satisfy conditions for both the common mode voltage range and the differential signal amplitude for the low voltage level of the flying voltage domain (e.g. 0 volts, 5 volts). Capacitances of $C_{TOP}$ and C20 may also be adjusted in view of any parasitic capacitance that may be present in a final layout of the level shifter according to the present teachings. In this case, and as noted above, ratios $C_{TOP}$/C20 and $R_{TOP}$/R20 may be chosen to be approximately inversely proportional in view of the parasitic capacitance. It should be noted that such inverse proportionality relationship need not be exact, but rather considered as an approximation.

Figure 6B:
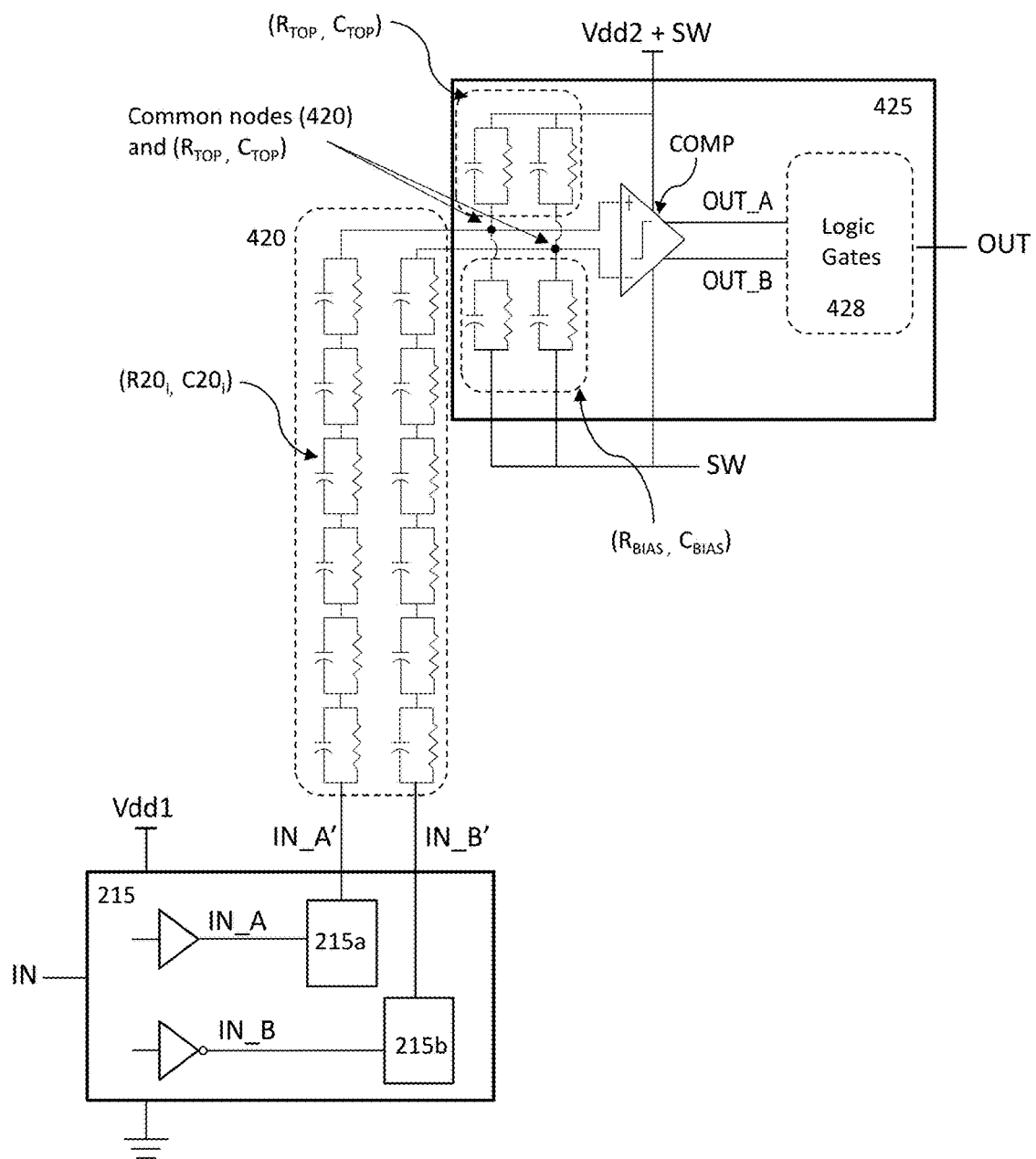
FIGS. 6B and 6C show variations of the HS level shifter shown in FIG. 6A, where charge pump circuits are used to increase voltage levels to input pulses to the HS level shifter.

A person skilled in the art would also realize that selecting the ratios for a given high voltage level of the flying voltage domain (SW, Vdd2+SW), of for example, (100 volts, 105 volts), such as to provide common mode voltage levels of the input differential signal that are within the acceptable operational voltage range of the flying comparator COMP, such selected ratios would also satisfy operational voltage range requirements of the flying comparator for lower high voltage levels, such as, for example, (50 volts, 55 volts). In such cases where lower high voltage levels are provided, it may be desirable, but not necessary, to increase the amplitude of the differential input signal to the flying comparator. According to an embodiment of the present disclosure, such increased amplitude of the differential input signal may be provided by way of charge pump circuits (215a, 215b) that increase the voltage level of the complementary input pulses (IN_A, IN_B) as depicted in FIG. 6B.

Figure 6C:
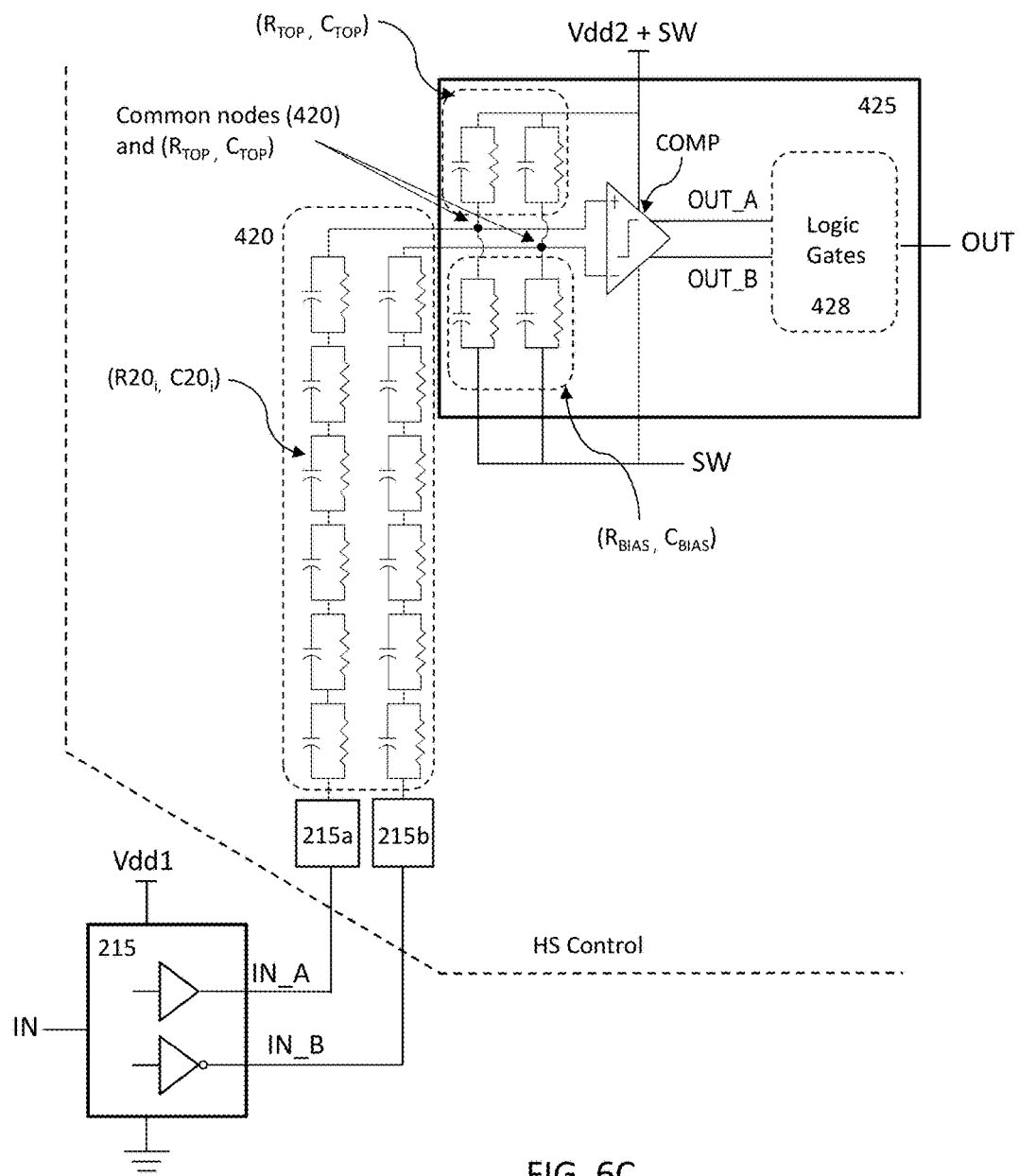

The programmable charge pump circuits (215a, 215b) may also be used to programmatically adjust voltage levels of the complementary inputs (IN_A, IN_B) according to different values of the high voltage level of the flying voltage domain (SW, Vdd2+SW). This can allow operation at higher high voltage levels (e.g. 200-300 volts and above) by compensating a reduction in amplitude of the differential input signal to the flying comparator, due to a required higher capacitance ratio $C_{TOP}$/C20, with an increase in amplitude of the input pulses (IN_A, IN_B), thereby effectively providing an amplitude of the differential input signal at a level that is detectable by the flying comparator COMP. It should be noted that although FIG. 6B shows the charge pump circuits (215a, 215b) as part of the common input logic block (215), such exemplary partitioning should not be considered as limiting the scope of the present disclosure, as a person skilled in the art would realize that the charge pumps (215a, 215b) may also be part of the HS control circuit (420, 425, 455) as shown in FIG. 6C. In general, a person skilled in the art would know how to partition the circuits discussed in the present application based on specific applications and packaging. As such, partitioning shown in the various figures of the present disclosure should not be considered as limiting the scope of the present disclosure.

With further reference to the HS level shifter (425) according to the present disclosure depicted in FIG. 6A, biasing points (e.g. voltages) of an input stage of the flying comparator COMP are provided by a parallel resistive-capacitive network ($R_{BIAS}$, $C_{BIAS}$) coupled to the positive/negative inputs of the flying comparator COMP. The fast response time of the capacitor $C_{BIAS}$ allows quick tracking of the biasing points responsive to a flying event of the flying voltage domain (SW, Vdd2+SW), while the resistor $R_{BIAS}$ allows for maintaining the biasing points based on settled voltage levels of the flying voltage domain (SW, Vdd2+SW). A person skilled in the art would realize that such biasing points establish voltage levels at the positive/negative inputs of the flying comparator COMP that remain within the operational voltage range of the flying comparator COMP discussed above.

Figure 7:
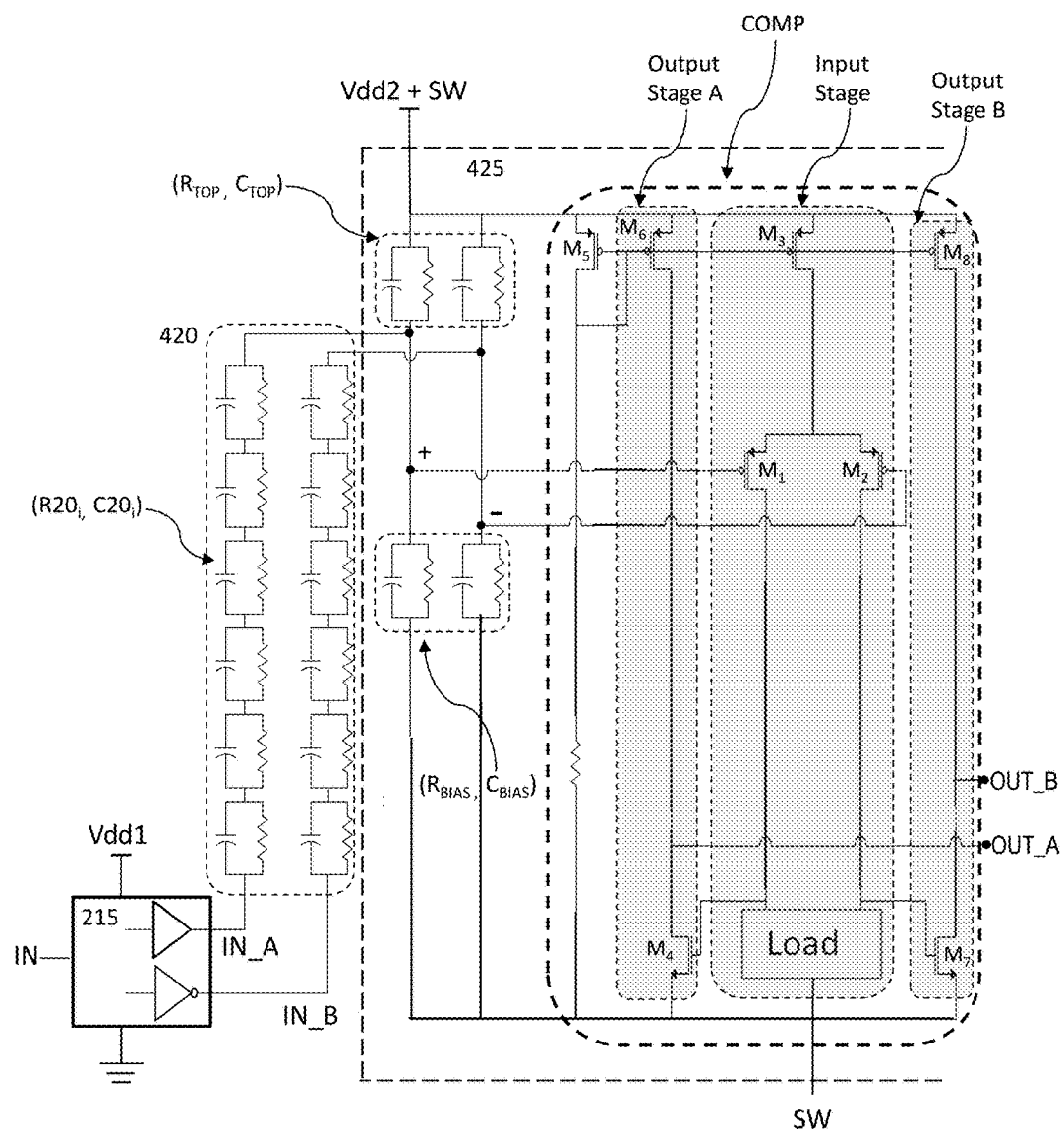
FIG. 7 shows details of the flying comparator circuit used in the HS level shifter of FIGS. 6A and 6B.

Further details of the HS level shifter (425) according to the present disclosure are shown in FIG. 7. In particular, FIG. 7 depicts inner circuit blocks of the flying comparator COMP which are well known to a person skilled in the art. As can be seen in FIG. 7, such inner circuit blocks may include an Input Stage and an Output Stage. The Input Stage comprises transistors (M1, M2, M3) and a Load circuit for providing a load (e.g. passive, active) to the differential input signal, and is coupled to the positive/negative input terminals (denoted +, − in FIG. 7) of the comparator COMP for receiving the differential input signal (e.g. via transistors M1, M2). The Output Stage is shown as an Output Stage A comprising transistors (M4, M6) and an Output Stage B comprising transistors (M7, M8), the Output Stage A and Output Stage B coupled to respective output terminals of the comparator COMP for outputting the complementary output signals (OUT_A, OUT_B) via transistors (M4, M7). Other transistors, such as transistors (M3, M5, M6, M8) may be used, for example, to provide current biasing to the various inner circuit blocks (e.g. to the Input Stage and the Output Stage). It should be noted that inner workings of a comparator are well known to a person skilled in the art and outside the scope of the present disclosure.

With further reference to FIG. 7, as noted above, the various transistors (e.g. M1-M7) used in the inner circuit blocks of the flying comparator according to the present disclosure are exclusively low voltage transistors, capable of withstanding, for example, the low voltage Vdd2 (e.g. 2.5 volts to 5 volts). A person skilled in the art readily knows that an analog comparator, such as the flying comparator COMP, includes current biasing circuits that produce conditions where low voltage transistors of the flying comparator COMP may have high impedance nodes (e.g. gate, drain, source) with respect to the supply voltage. Some such transistors may also have nodes with low impedance with respect to the supply voltage.

Figure 8A:
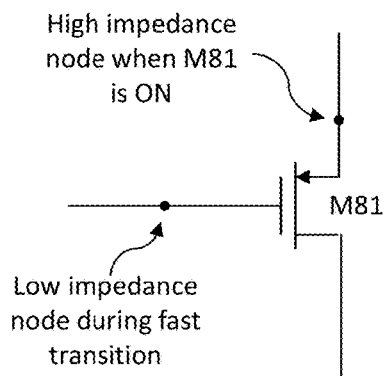
FIG. 8A shows a transistor of the flying comparator with a high impedance node and a low impedance node with respect to a flying voltage.
Figure 8B:
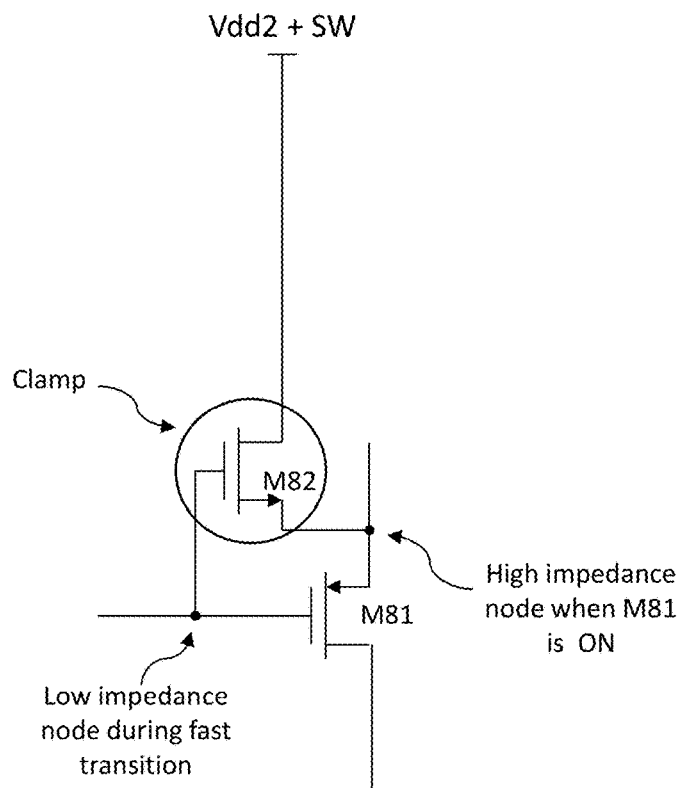
FIG. 8B shows a clamping circuit provided to protect over voltage across the low impedance node and the high impedance node of the transistor depicted in FIG. 8A.

Therefore, and with reference to FIG. 8A, in a case where the supply voltage flies (switches) from a first voltage (e.g. Vdd2=5 volts) to a second voltage (e.g. Vdd2+SW=105 volts) in a time (e.g. 1 ns) shorter than a voltage response time of a high impedance node of a low voltage transistor M81, voltage at the high impedance node would lag the voltage at a low impedance node (having a fast voltage response time obtained, for example, via a capacitive coupling to the flying voltage). The lag in voltage between the two nodes can therefore create a voltage drop across the two nodes of the transistor that is substantially larger than a withstand (e.g. breakdown) voltage of the transistor, thereby causing gate breakdown (TDDB) or hot-carrier injection (HCI) related reliability issues of the transistor M81. It follows that according to an embodiment of the present disclosure, clamps comprising exclusively low voltage transistors are strategically used across such low impedance and high impedance nodes of devices within the flying comparator COMP of the present disclosure, thereby allowing safe operation of the low voltage devices in spite of a high slew rate of the flying supply. This is shown in FIG. 8B. Such clamps may be coupled to either a top local supply rail (e.g. Vdd2+SW), referred to as top clamps, or a bottom local supply rail (e.g. SW), referred to as bottom clamps.

With reference to FIG. 8B, a low voltage transistor M82 functions as a clamp according to the present disclosure to pull the high impedance node of the low voltage transistor M81 to the flying voltage (Vdd2+SW) when a voltage difference between the high impedance node and the low impedance node of the transistor M81 becomes sufficiently low or negative (while remaining within a withstand voltage of the transistor) to trigger the clamping transistor M82. It should be noted that the low voltage transistor M81 can be any low voltage transistor within the flying comparator COMP having combination of high impedance and low impedance nodes with respect to the flying voltage. In other words, clamping according to the present disclosure can be provided to nodes other than nodes associated with the input stage of the flying comparator shown in FIG. 7. A person skilled in the art would appreciate the benefits of using low voltage transistors (e.g. M82) for providing a clamping feature according to the present disclosure, and therefore not requiring high voltage devices, such as, for example, high voltage rectifiers as known in the art. It should also be noted that the low impedance node of the transistor M81, which has a gate capacitance Cg, may only be considered as low impedance during a fast transition of the switching voltage SW. Also, the high impedance node of the transistor M81 may be considered as high impedance only when the voltage at that node decreases to turn OFF the transistor M81 (e.g. Vgs>Vth), otherwise, such node is a low impedance node (e.g. Vgs<Vth).

Figure 9A:
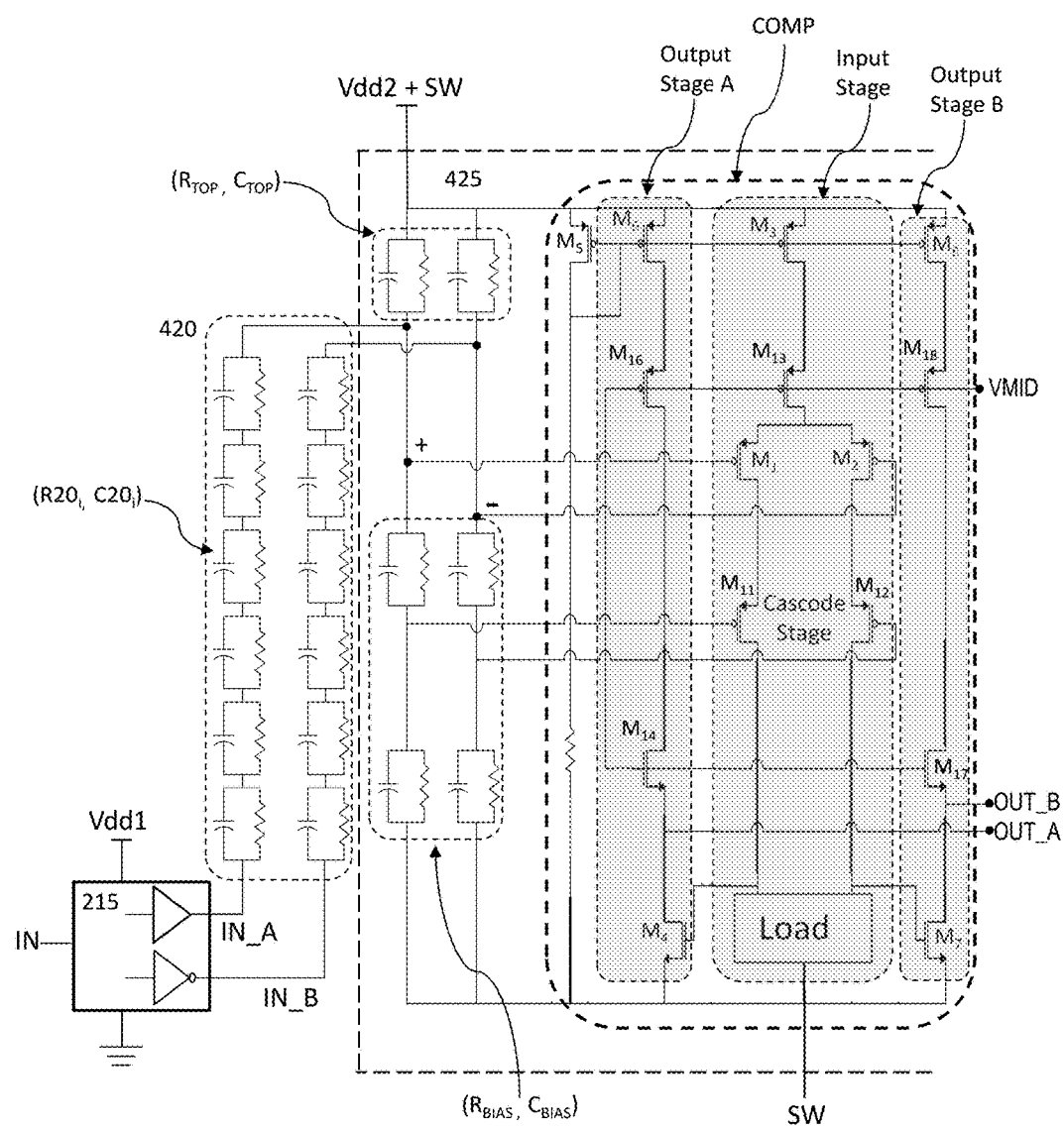
FIG. 9A shows an embodiment according to the present disclosure where a cascode stage is used to allow operation of the flying comparator over a voltage higher than a voltage withstand capability of the low voltage transistors of the flying comparator.

According to some exemplary embodiments, the low voltage Vdd2 of the flying voltage domain (SW, Vdd2+SW) may be greater than a voltage withstand capability of the low voltage transistors used in the HS level shifter (425) according to the present teachings. According to a non-limiting exemplary case, the voltage withstand capability of the low voltage transistors may be 2.5 volts, and the voltage Vdd2 may be about 5 volts. Accordingly, in order to protect the low voltage transistors of the flying comparator COMP and other circuits within the HS level shifter (425), cascode transistor configurations, as known to a person skilled in the art, may be used to divide the voltage Vdd2 across more than one low voltage transistor, so that no transistor is subjected to any voltage higher than its voltage withstand capability. This is shown in FIG. 9A, where the (differential) Input Stage of the flying comparator COMP comprises a (differential) Cascode Stage, comprising transistors (M11, M12), that further divides the voltage Vdd2 across transistors of the flying comparator COMP so that no transistor is subjected to a voltage higher than its voltage withstand capability. As shown in FIG. 9A, a separate parallel resistive-capacitive network ($R_{BIAS}$, $C_{BIAS}$) may be provided for biasing transistors of the Cascode Stage.

Further limiting of voltage across any two nodes of the low voltage transistors used in the flying comparator COMP and other circuits within the HS level shifter (425) according to the present teachings may be provided by biasing associated internal transistors via a mid-rail flying biasing voltage VMID based on the flying voltage domain (SW, Vdd2+SW). The mid-rail flying biasing voltage VMID can be configured to be at a voltage level ½*Vdd2 above the flying reference voltage provided at node SW. For example, in a case where the flying reference voltage at node SW flies from 0 volts to 100 volts and Vdd2 is equal to 5 volts, then the mid-rail flying biasing voltage VMID flies from 2.5 volts to 102.5 volts. As shown in FIG. 9A, transistors (M13, M14, M16, M17, M18) are biased with the mid-rail flying biasing voltage VMID provided to the flying comparator COMP.

FIG. 9A shows the mid-rail flying biasing voltage VMID fed to gates of internal low voltage transistors of the flying comparator COMP such as to limit voltage drop across any two nodes of the low voltage transistors to within associated voltage withstand capability of the transistors (e.g. 2.5 volts), while operating the flying comparator COMP from the flying voltage domain (SW, Vdd2+SW), where Vdd2 is greater than said withstand voltage (e.g. Vdd2=5 volts). As can be seen in FIG. 9A, by biasing the output stage of the flying comparator COMP with the mid-rail flying biasing voltage VMID, complementary output signals (OUT_2A, OUT_2B can be made to operate within levels SW and ½*Vdd2. Similarly, FIG. 9B shows a logic gate (900) operating in the flying voltage domain (SW, Vdd2+SW) comprising low voltage transistors M91-M94 having a voltage withstand capability of (½*Vdd2), wherein the mid-rail flying voltage VMID biases transistors M92, M93 such as to limit voltage across any two nodes of the transistors M91-M94 irrespective of an output state condition at the output terminal OUT of the logic gate (900).

Figure 9B:
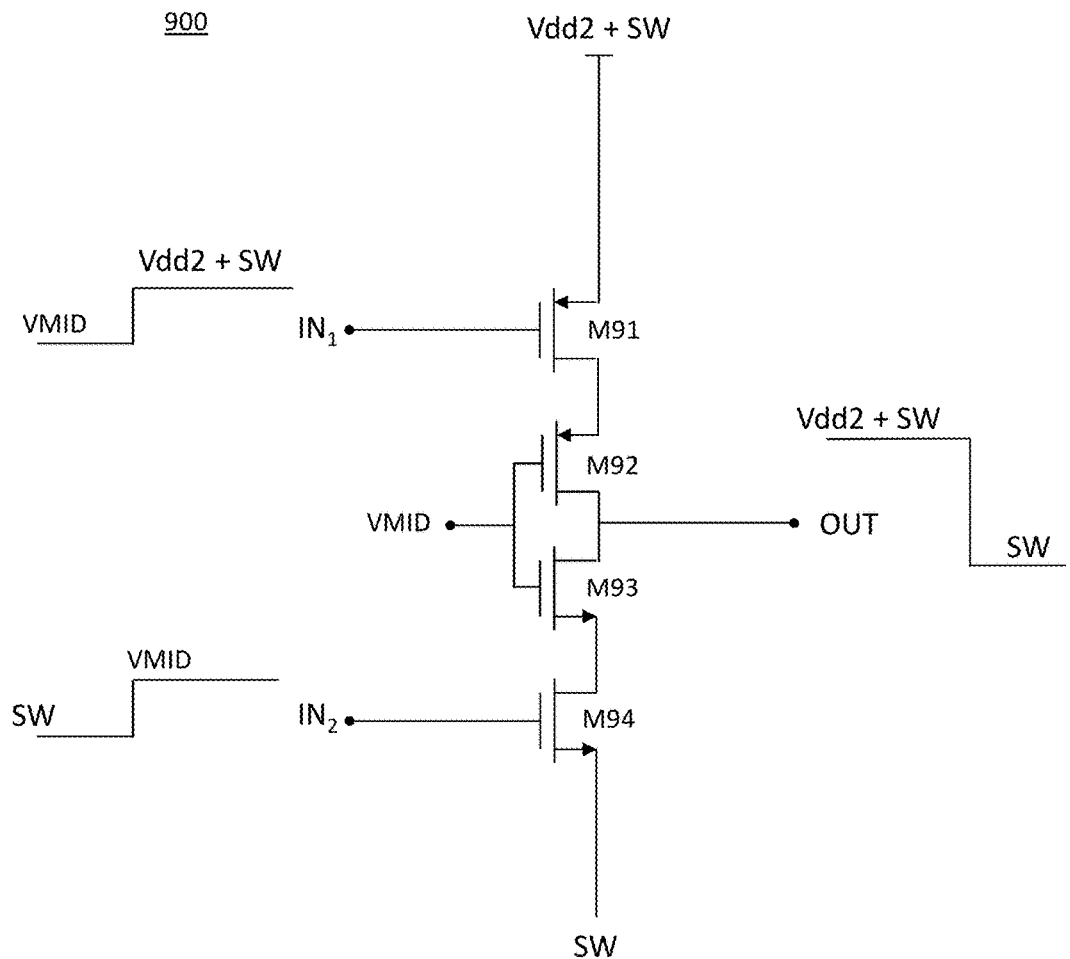
FIG. 9B shows an exemplary embodiment of two gate drivers operating over different flying voltage domains.

With further reference to the logic gate (900) of FIG. 9B, a person skilled in the art would realize that transistors M91, M92 may be considered as a logic inverter having an input $IN_1$ operating within the flying voltage domain (SW+½*Vdd2, SW+Vdd2) and transistors M93, M94 may be considered as a logic inverter having an input $IN_2$ operating within the flying voltage domain (SW, SW+½*Vdd2). As can be seen in FIG. 9B, when both inputs $IN_1$, $IN_2$ are at their low states, the output state at the OUT terminal is at a high state with a corresponding voltage level of Vdd2+SW, and when both inputs $IN_1$, $IN_2$ are at their high states, the output state at the OUT terminal is at a low state with a corresponding voltage level of SW. A person skilled in the art would recognize that for a combination of input logic states ($IN_1$, $IN_2$)=(High, Low), a voltage level at the OUT terminal can be at SW+½*Vdd2.

It is within the ability of a person skilled in the art to design, based on the exemplary logic inverters of FIG. 9B discussed above, logic gates with different functionalities (AND, NAND, NOR, OR, etc.) operating on either (SW+½*Vdd2, SW+Vdd2) or (SW, SW+½*Vdd2) flying voltage domains, where the mid-rail flying voltage VMID is used to bias transistors having a voltage withstand capability that is lower than the Vdd2 voltage. It follows that the logic gates (428) of the HS level shifter (425) depicted in FIG. 6A can be designed to operate on either (SW+½*Vdd2, SW+Vdd2) or (SW, SW+½*Vdd2) flying voltage domains. According to some exemplary embodiments, separate level shifters may be used to shift the logic rails. These types of level shifters that provide a fixed voltage shift (e.g. 0-2.5V to 2.5-5V) are known to a person skilled in the art.

The flying comparator COMP has complementary output signals (OUT_A, OUT_B) that are high impedance. During a fast SW flying event, these two outputs generally come together (i.e. reach a substantially same value while the flying voltage domain flies). For example, if OUT_A=logic 0 and OUT_B=logic 1, SW flying high (i.e. switching from 0 volts to 100 volts) would cause the OUT_B logic 1 to drop to logic 0 and activate a bottom clamp during the switching transient. Conversely, SW flying low (i.e. switching from 100 volts to 0 volts) would cause OUT_A logic 0 to go up to logic 1 and activate a top clamp during the switching transient. Effectively, OUT_A-OUT_B=0 during SW flying event, as shown in the timing diagram of FIG. 10A. This allows in turn to identify a switching event at the switching node SW via the difference signal, and accordingly act upon during a processing phase by the logic gates (428 of FIG. 6A) of the output signal OUT. In other words, clamping of the high impedance nodes of the flying comparator COMP along with logic circuit around a latch according to the present teachings creates a filter-like block that removes unwanted glitches during a switching event.

It follows that by designing logic that is configured to act only upon non-zero values of the difference signal OUT_A-OUT_B (and therefore reject any zero values), an output signal OUT of the HS level shifter (425) according to the present disclosure that is immune to any effects of switching events at the switching node SW may be provided. Such exemplary logic circuit is shown in FIG. 10B, where an SR (set-reset) latch (130) is used to act only upon non-zero values of the difference signal OUT_A-OUT_B. A person skilled in the art is well aware of the principle of operation and function of the latch (130), including its two stable output states selected via complementary input levels to the SR latch (130). Auxiliary logic gates, including inverter gates (110, 115), NAND gates (120, 125), and AND gate (140) complement the SR latch (130) to provide a desired functionality of the logic gate circuit (428) according to the timing diagram of FIG. 10A. It should be noted that the logic gates depicted in FIG. 10B may include exclusively low voltage transistors having a voltage withstand capability (e.g. ½ *Vdd2) that is lower than the voltage Vdd2 (e.g. 5 volts). Therefore, such logic gates, as described above with reference to FIG. 9B, may operate over one of (SW, ½ *Vdd2+SW) or (½*Vdd2+SW, Vdd2+SW).

According to one exemplary embodiment of the present disclosure, the logic gates depicted in FIG. 10B may operate over (SW, ½ *Vdd2+SW). As can be seen in the corresponding timing diagram of FIG. 10A, a tripping point of the logic gates for the leading edge of the OUT signal occurs at a mid-voltage between 0 volts and 2.5 volts (e.g. 1.25 volts) of the difference signal OUT_A-OUT_B, and a tripping point of the logic gates for the trailing edge of the OUT signal occurs at a mid-voltage between −2.5 volts and 0 volts (e.g. −1.25 volts) of the difference signal OUT_A-OUT_B. Such large hysteresis (+1.25−(−1.25)=2.5 volts) provided by said tripping points allow for a robust design of the logic gate circuit (428) according to the present disclosure.

Figure 10A:
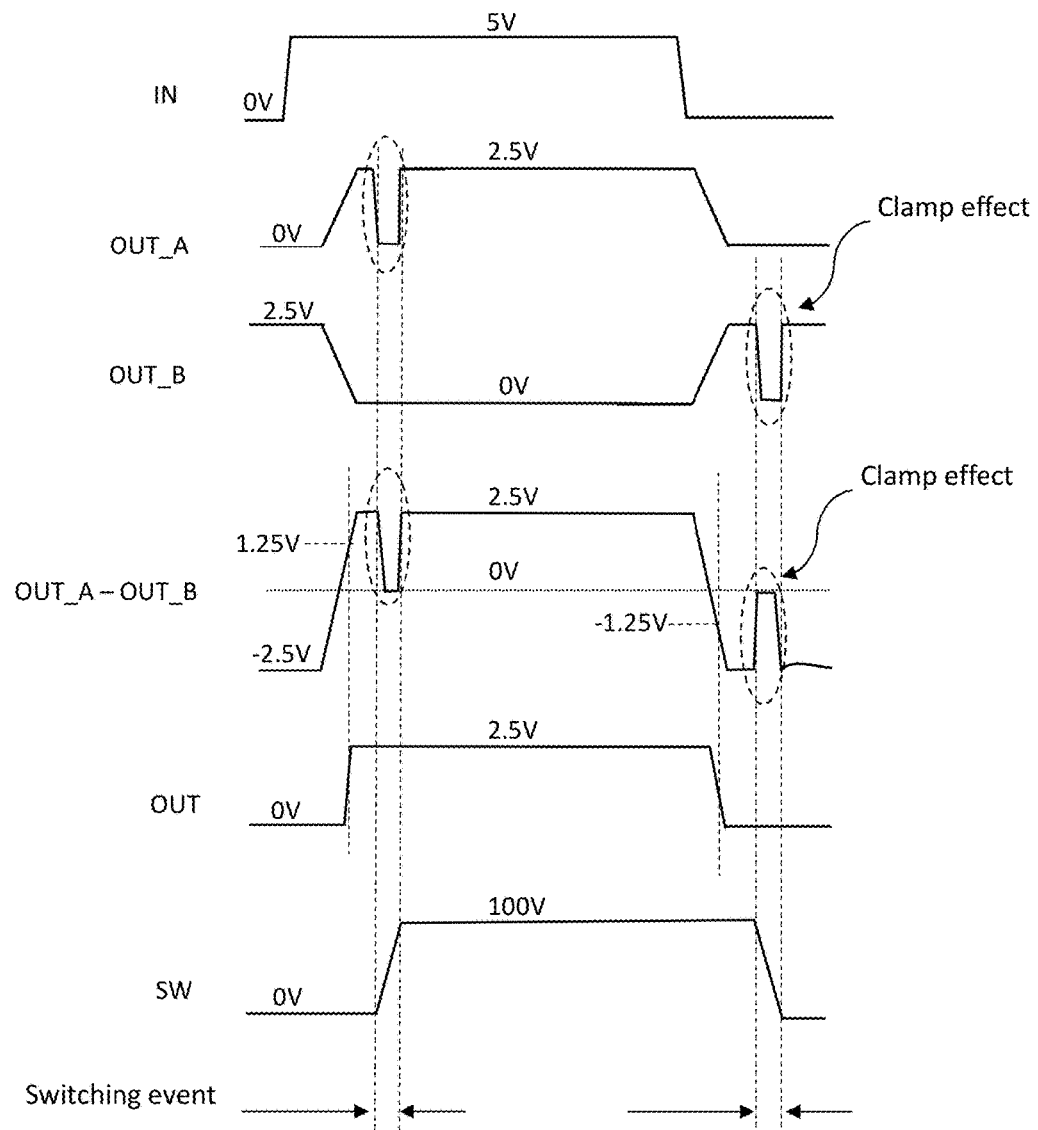
FIG. 10A shows a timing diagram according to an exemplary embodiment of the present disclosure of a logic circuit acting upon a differential output signal of the flying comparator.
Figure 10B:
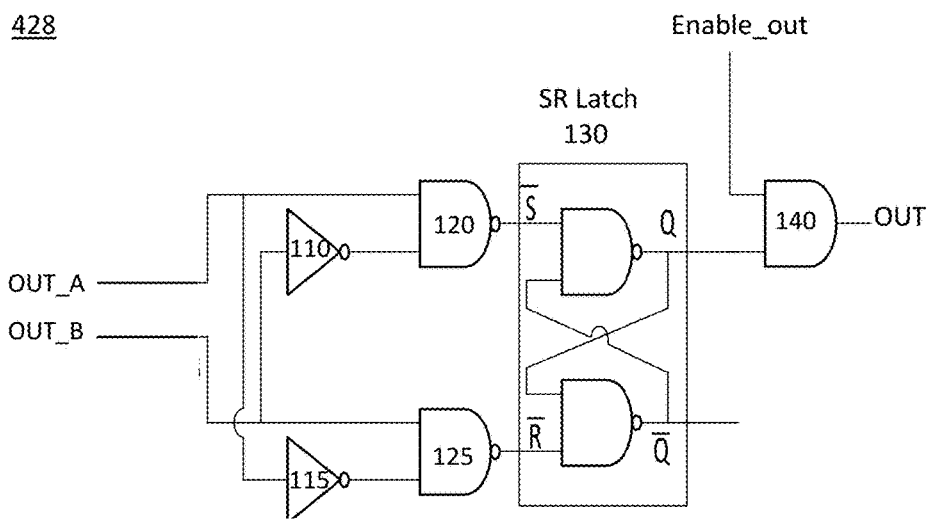
FIG. 10B shows an exemplary embodiment according to the present disclosure of a logic circuit for providing the timing diagram depicted in FIG. 10A.

It should be noted that the timing diagram of FIG. 10A may be considered as a simplified representation of functioning of the logic circuit (428) of FIG. 10B based on the difference signal OUT_A-OUT_B, which is equivalent to having roughly a 2.5 volts hysteresis to prevent the circuit from false triggering during a flying event. For example, as shown in FIG. 10A, a −2.5 volts to +2.5 volts rising edge transition of the difference signal OUT_A-OUT_B may trigger the logic circuit (428) at +1.25 volts. Also, a +2.5 volts to −2.5 volts falling edge transition of the difference signal OUT_A-OUT_B may trigger the logic circuit (428) at −1.25 volts (providing a hysteresis of +1.25−(−1.25)=2.5 volts). On the other hand, as can be seen in FIG. 10A, any glitch due to a flying event may cause the difference signal OUT_A-OUT_B to go to 0 volts which is not enough to trigger the logic used in the circuit (428). To explain how this works, let's look at FIG. 10B. OUT_A and OUT_B are complementary signals. NAND gate (120) is connected to OUT_A and /OUT_B, and therefore, NAND gate (120) outputs a low logic level and set the SR latch (130) output to high when OUT_A is high and OUT_B is low. NAND gate (125) is connected to /OUT_A and OUT_B, and therefore, NAND gate (125) outputs a low logic level to reset the SR latch (130) output to low when OUT_A is low and OUT_B is high. Effectively, it requires two transitions for the SR latch (130) to change state: in other words, both OUT_A and OUT_B need to change state in order to change output state of the SR latch (130). As any flying event would only cause one of the outputs OUT_A and OUT_B to change state, such flying event may not cause the SR latch (130) to change state.

According to a non-limiting embodiment of the present disclosure, the output signal OUT of the HS level shifter (425) may be gated by an enabling signal Enable_out, as depicted in FIG. 10B. A person skilled in the art would realize that the logic gate circuit (428) translates a differential input signal (OUT_A, OUT_B) to a single ended output signal OUT.

According to an exemplary embodiment of the present disclosure, the output signal OUT depicted in FIG. 10B may be buffered and provided to the input IN$_2$ depicted in FIG. 9B. The output signal OUT may also be provided to a level shifter that shifts its logic level from (0, ½ *Vdd2) to (½ *Vdd2, Vdd2). The output of the level shifter may then be provided to the input IN$_1$ depicted in FIG. 9B.

With reference back to the gate driver circuit of FIG. 4, for such DC voltage conversion circuit to operate in an efficient and reliable manner, it is desirable that the low side transistor T1 and the high side transistor T2 are not on at the same time, or a short circuit can exist between V$_{IN}$ and GND (causing the shoot through current), thereby wasting power and potentially damaging the circuit and the transistor devices T1 and T2. Due to the difference in propagation delay between the low side control path and the high side control path as described above, often caused by layout, manufacturing or other variations, an ON control signal (e.g. an edge of the signal output by the LS control circuit 435) at T1 can arrive before its complementary OFF signal (e.g. an edge of a signal output by the HS control circuit 420, 425, 455) arrives at T2, therefore providing an overlap time during which both transistors T1 and T1 are ON. During the overlap time, both transistors are ON, causing the problems noted above.

It follows that according to an embodiment of the present disclosure, the gate driver circuit (410) of FIG. 4 is fitted with a dead time controller to provide a dead time control as discussed above. Such dead time controller can be part of the common input logic block (215) shown in FIG. 4, and operate between the low voltage supply Vdd1 and the reference potential GND. Therefore, the dead time controller according to the various embodiments of the present disclosure comprises low voltage transistors operating within their breakdown voltages.

Figure 11:
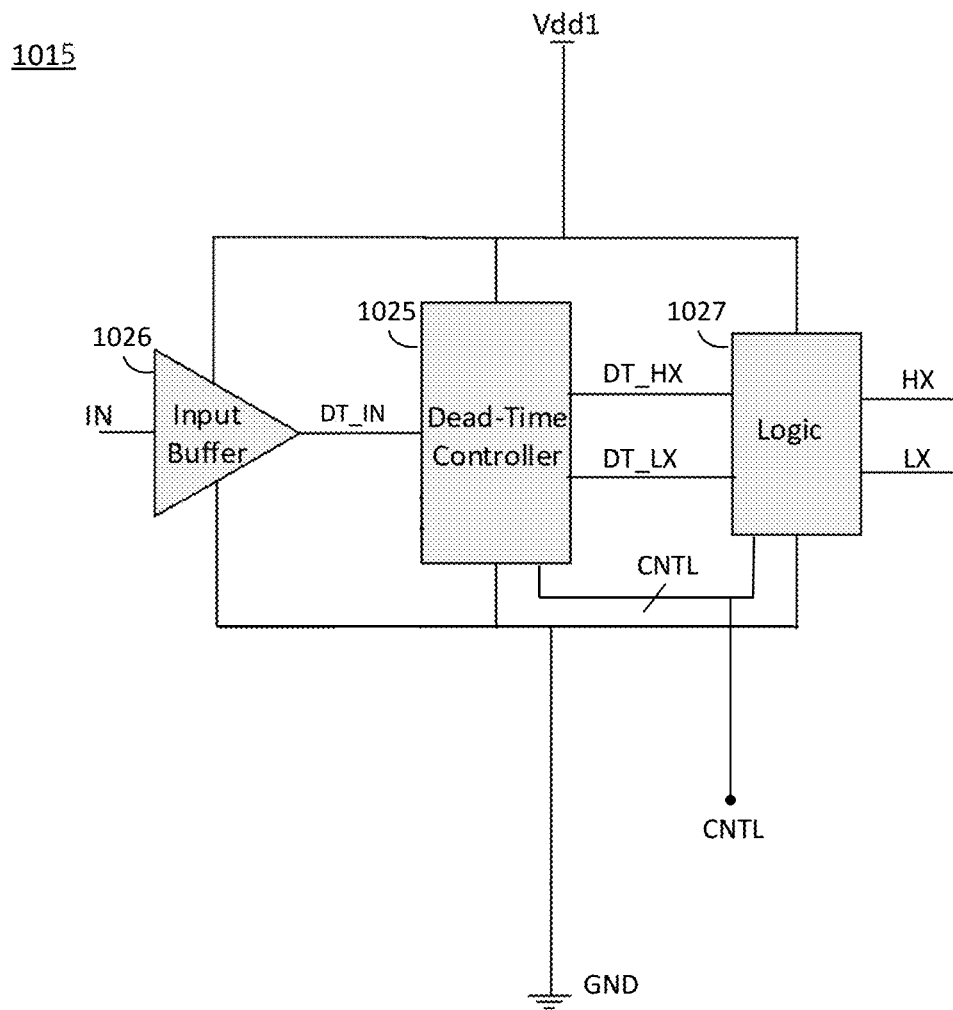
FIG. 11 shows more details of a common input logic block of the gate driver circuit shown in FIG. 4, comprising a dead time control circuit.

FIG. 11 shows more details of a common input logic block (1015) comprising the dead time controller (1025) placed between the input buffer (1026) and the logic block (1027). Such common input logic block may be the block (215) shown in FIG. 4. As can be seen in FIG. 11, the input signal IN is provided to the input buffer (1026) which provides a buffered version of the input signal, DT_IN, to the dead time controller (1025) for dead time adjustment. In turn, the dead time controller (1025) adjusts the edges of the DT_IN signal to provide a low side dead time adjusted signal DT_LX and a high side dead time adjusted signal DT_HX, based on the control signals CNTL. The dead time adjusted signals are then fed to the logic block (1027) which generates signal LX, corresponding to the signal DT_LX, to provide timing control of the low side transistor T1, and signal HX, corresponding to the signal DT_HX, to provide timing control of the high side transistor T2. Dead time controller (1025) as well as various functions of the logic block (1027) are controlled via control signals CNTL provided to the logic block (1027). According to an exemplary embodiment of the present disclosure, under control of the control signals CNTL, the logic block (1027) passes or blocks the DT_LX and DT_HX signals generated by the dead time controller (1025) to/from a next stage of the processing blocks of the gate driver circuit (1010) depicted in FIG. 10. The person skilled in the art will realize that other logic functions and corresponding signals may be required for other system level operations of the gate driver circuit (410) of FIG. 4, which for the sake of clarity in the functional description of the dead time controller are not shown in FIG. 4 and FIG. 11.

As seen in FIG. 11, and according to some embodiments of the present disclosure, the dead time control circuit (1025) produces a differential output with the desired dead time based on the single ended input signal, DT_IN. According to the exemplary embodiment depicted in FIG. 11, the dead time controller (1025) can use a fixed or programmable timing control circuit that can generate timing adjusted signals DT_HX and DT_LX independently of one another.

Figure 12A:
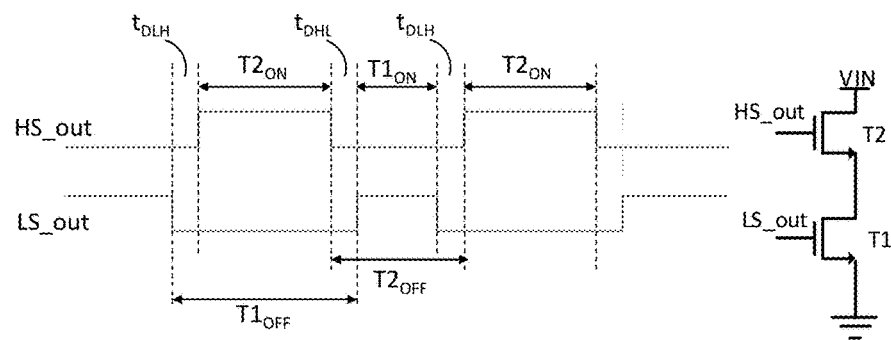
FIGS. 12A, 12B and 12C show timing diagrams of the high side and the low side control signals generated by the gate driver of FIG. 4.

As discussed above, since $V_{IN}$ can be a large voltage, e.g. 10-100V and higher, and an ON resistance $R_{ON}$ of each of the GaN FETs (T1, T2) is low, e.g. <1Ω, in order not to damage transistors T1 and T2, it is desirable that such transistors not be ON (conducting) at the same time, or equivalently, that HS_out and LS_out signals not be high at the same time, as shown in FIG. 12A, assuming that both transistors T1 and T2 turn ON at the high level of the control signals HS_out and LS_out. Having both transistors, T1 and T2, ON at the same time, leads to very large shoot-through currents in the transistors. This can have the undesired effect of dramatically reducing the efficiency of the circuit shown in FIG. 4, and potentially damage T1 and T2. As noted above, careful control of the timing (e.g. relative edge positions) of LS_out and HS_out signals can prevent such undesired effect. For other applications noted above, such as Class D audio amplifiers, having both transistors T1 and T2 either ON or OFF can cause signal distortion that is a key hallmark of audio amplifiers.

FIG. 12A shows the timing relationship between the high side control signal, HS_out, and the low side control signal, LS_out. As discussed above, such timing can be adjusted by the dead time control circuit according to the present disclosure. As can be seen in FIG. 12A, signal HS_out is high during a time interval $T2_{ON}$, corresponding to an ON state of the high side transistor T2, and low during a time interval $T2_{OFF}$, corresponding to an OFF state of the high side transistor T2. Similarly, signal LS_out is high during a time interval $T1_{ON}$, corresponding to an ON state of the low side transistor T1, and low during a time interval $T1_{OFF}$, corresponding to an OFF state of the low side transistor T1.

With further reference to the timing relationship of FIG. 12A, one can see that time intervals $T2_{ON}$ and $T1_{ON}$ are separated by non-zero time intervals $t_{DLH}$ and $t_{DHL}$. Such non-zero time intervals each define a positive dead time between the timing controls of the high side and the low side transistors T2 and T1. That is, assuming that both transistors T1 and T2 have a same turn ON time and a same turn OFF time, their ON states will not overlap, similar to the timing diagram of the associated control signals depicted in FIG. 12A. It should be noted that the dead time controller according to the present disclosure can generate positive and negative (described below) dead times, where the time intervals $t_{DLH}$ and $t_{DHL}$ are not necessarily of a same value.

Figures 12B, 12C:
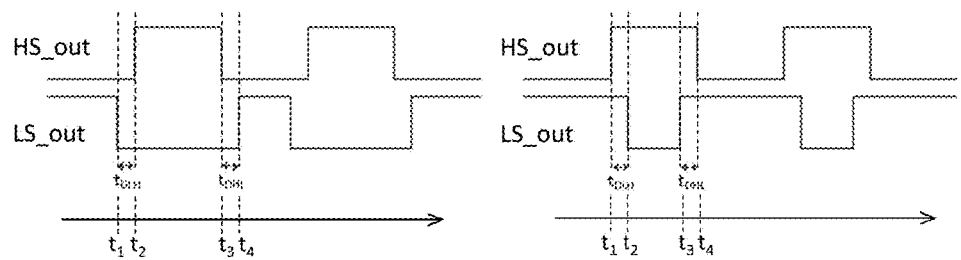

FIG. 12B shows the timing relationship between the high side control signal, HS_out, and the low side control signal, LS_out, for a positive dead time (i.e, $t_{DLH}$ and $t_{DHL}$ are both positive). According to a convention of the present disclosure, a positive dead time is defined by a positive time interval $t_{DLH}$ and/or a positive time interval $t_{DHL}$, where such time intervals are measured as the difference in timing position of a turn-ON transition (e.g. at times t2, t4) of a control signal and a turn-OFF transition (e.g. at times t1 and t3) of the alternate control signal. Accordingly, $t_{DHL}$ is the time interval between the rising transition of the low side control signal LS_out (at time t4) and the falling transition of the high side control signal HS_out (at time t3), therefore $t_{DHL}$=(t4−t3). Similarly, $t_{DLH}$ is the time interval between the rising transition of the high side control signal HS_out (at time t2) and the falling transition of the low side control signal LS_out (at time $t_1$), therefore $t_{DLH}$=(t2−t1).

Using the above convention, the timing diagram of FIG. 12B shows positive dead time for both the high side and the low side paths, whereas the timing diagram of FIG. 12C shows negative dead time for both paths. As stated above, positive dead time at LS_out (LS_out rising transition comes after HS_out falling transition) and HS_out (HS_out rising transition comes after LS_out falling transition) can be a preferred condition for operating the high voltage transistors T1 and T2. In some cases where, for example, the high side and low side paths have a fixed delay skew between them, or the transistors T1 and T2 have different characteristics, it may be desirable to provide a negative dead time at one of, or both, of the LS_out and HS_out signals. Accordingly, the dead time controller according to the present disclosure enables both positive and negative dead times. Since the primary usage is typically with a positive dead time, unless otherwise stated, the descriptions below should be understood to be for positive dead time.

To clarify the basic operation of the dead time controller of the present disclosure, it is assumed that the low side and high side paths have equal propagation delays, which means the dead time between the DT_HX and DT_LX signals depicted in FIG. 11 (and FIG. 4) equals the dead time between the HS_out and LS_out signals depicted in FIG. 10. For the case of unequal propagation delays between the high side and the low side paths, the adjusting function of the dead time control circuit of the present disclosure may be used to further compensate for a difference in the propagation delays.

Figure 13:
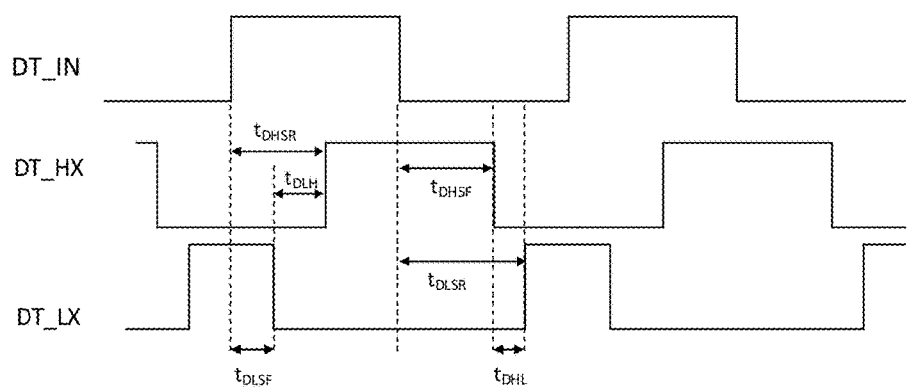
FIG. 13 shows exemplary relative timing of control signals generated by the dead time control circuit of the present disclosure.

As described above, the DC output of the overall circuit of FIG. 4 obtained after filtering (e.g., by a low pass filter), is proportional to the duty cycle at the common output node SW, hence the duty cycle of the high side dead time adjusted signal DT_HX is essentially equal to the duty cycle of the input signal IN (thus of DT_IN). For the high side signal DT_HX to have the same duty cycle of the input signal IN, the time intervals $t_{DHSR}$ and $t_{DHSF}$, as defined below in FIG. 13, are essentially equal. Again, to simplify the basic description of the circuit while maintaining the desired DC output voltage, and therefore a corresponding desired duty cycle at the common output node SW, dead time adjustments will be confined to the low side circuitry, while the high side circuitry will be set to follow the desired duty cycle. In other words, under control of the dead time controller (1025) of the gate driver circuit (410), the high side transistor T2 is ON for a same time duration ($T2_{ON}$ of FIG. 12A later described) as an ON time of an output of a pulse width modulator representing the average ON/OFF ratio of the signal at the common output node SW represented by the input signal IN to the gate drive circuit (410).

FIG. 13 shows the relative timing of the dead time controller signals according to an embodiment of the present disclosure. These signals include the input signal to the dead time controller, DT_IN, its high side output signal, DT_HX, and its low side output signal, DT_LX. As stated above, to ensure the proper output DC voltage, the duty cycle, as set by the ON duration of the HS transistor T2, should equal the duty cycle of DT_IN. The timing diagram of the dead time controller depicted in FIG. 13 ensures that both transistors are not ON at the same time while providing a desired DC output voltage defined by the duty cycle of the input signal, IN, and therefore of the input signal to the dead time controller, DT_IN.

As shown in the timing diagram depicted in FIG. 13, the rising edge of DT_LX is delayed, with respect to the falling edge of DT_HX, by a time interval of length $t_{DHL}$, while the falling edge of DT_LX is advanced, with respect to the rising edge of DT_HX, by a time interval of length $t_{DLH}$. This ensures a desired operation where no overlap between an ON state of the HS control signal and an ON state of the LS control signal exist. Such desired operation in the exemplary embodiment depicted by the associated timing diagram of FIG. 13 provides positive dead times ($t_{DHL}$, $t_{DLH}$) at both transitions of the high side control signal. As mentioned above, there may be a desire to create a negative dead time, in which case a person skilled in the art will recognize that the rising and falling edges would be adjusted in opposite directions to those described for the positive dead time control described herein and with reference to FIG. 13.

Having described the overall function of dead time controller according to some embodiments of the present disclosure, an exemplary embodiment is now described in detail. Based on the timing diagram shown in FIG. 13, a person skilled in the art will recognize that the dead time adjusted signal DT_HX can be obtained, for example, by independently delaying leading (rising) and trailing (falling) edges of positive pulses of the DT_IN signal, and that the dead time adjusted signal DT_LX can be obtained, for example, by independently delaying leading and trailing edges of the positive pulses of the DT_IN signal followed by inverting the obtained delayed signal. Likewise, same delaying operations may be performed on leading (falling) and trailing (rising) edges of negative pulses of the DT_IN signal to obtain the dead time adjusted signals DT_HX and DT_LX.

Figure 14A:
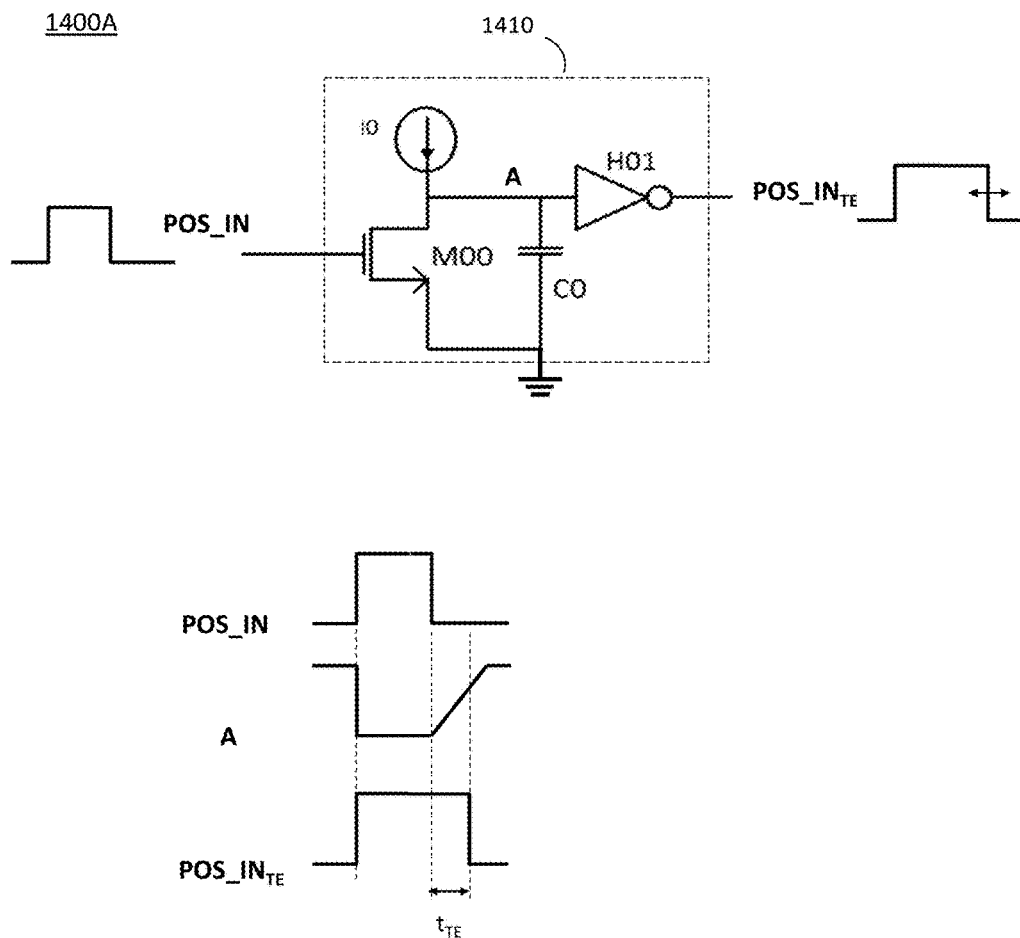
FIGS. 14A and 14B show a basic edge delay circuit according to an embodiment of the present disclosure.
Figure 14B:
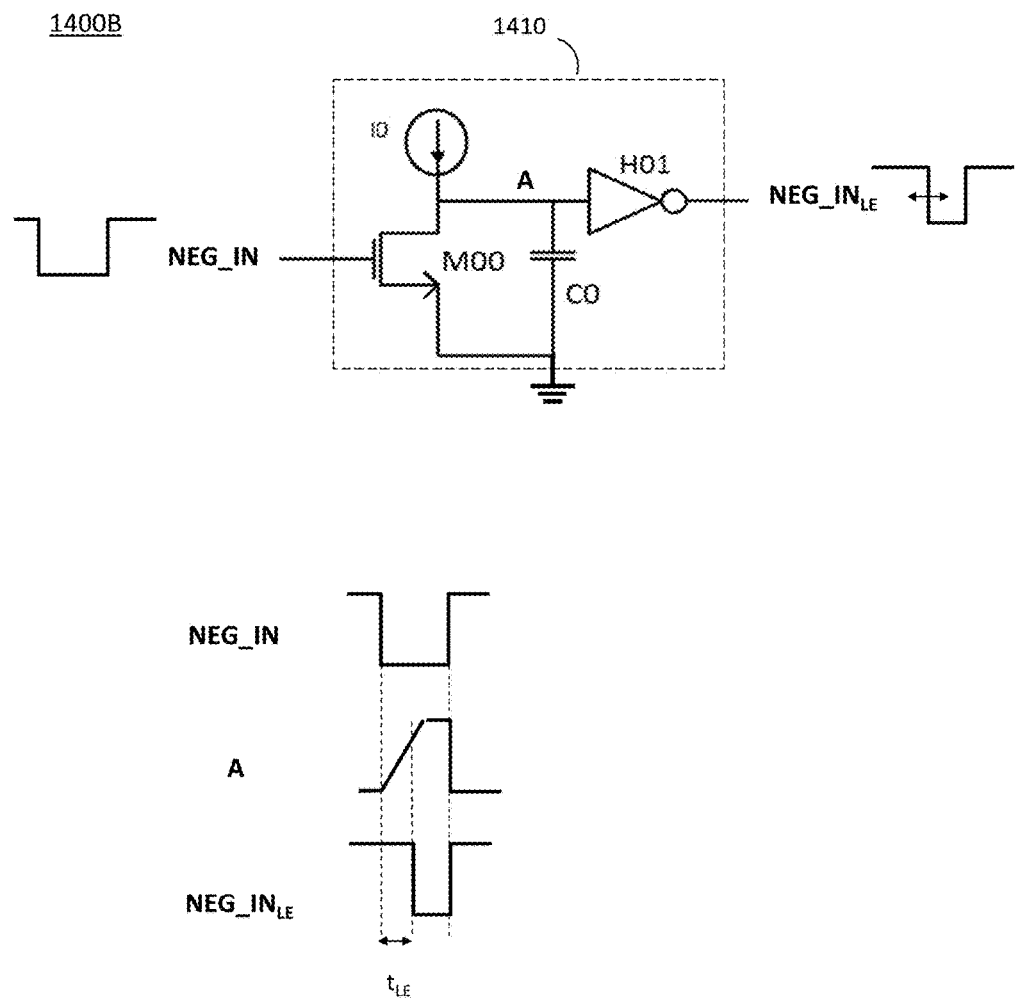

FIGS. 14A and 14B show a basic edge delay circuit (1410) according to an embodiment of the present disclosure that can be used to generate the dead time adjusted signals DT_HX and DT_LX based on the DT_IN signal. FIG. 14A shows a positive pulse, POS_IN, processed by the basic edge delay circuit (1410) and FIG. 14B shows a negative pulse, NEG_IN, processed by the basic edge delay circuit (1410). As can be seen in FIG. 14A, the circuit (1410) takes the positive pulse, POS_IN, and outputs a positive pulse, POS_IN$_{TE}$, which corresponds to the positive pulse POS_IN with a delayed timing of the trailing edge and a substantially same timing of the leading edge. Likewise, as can be seen in FIG. 14B, the circuit (1410) takes the negative pulse, NEG_IN, and outputs a negative pulse, NEG_IN$_{LE}$, which corresponds to the negative pulse NEG_IN with a delayed timing of the leading edge and a substantially same timing of the trailing edge.

The basic edge delay circuit (1410) achieves a trailing edge delay of a positive pulse input to the circuit and a leading edge delay of a negative pulse input to the circuit, while maintaining polarity (positive or negative) of the pulse input to the circuit. It follows that cascading (series connecting) a plurality of such circuits, leads to an output pulse having a same polarity as an input pulse and delaying of a same leading and/or trailing edge of the input pulse. The basic edge delay circuit (1410) comprises a transistor M00 that operates as a shunting switch having an ON and an OFF state. A falling edge of an input pulse signal provided at the gate of the transistor M00, turns OFF the transistor M00, and a rising edge of the input pulse signal turns ON the transistor.

Considering the positive pulse signal, POS_IN, as shown in FIG. 14A, at a time prior to the leading (rising) edge, since the signal is at a low level, the transistor M00 is turned OFF and therefore the capacitor C0 is fully charged, keeping the voltage at node A, input of the inverter H01, above the trigger point of the inverter, and therefore the output of the inverter H01 is at a low level (i.e., following the input pulse signal, POS_IN). When the leading edge of the positive pulse signal, POS_IN, arrives, the transistor M00 turns ON, shorting out the capacitor C0 and causing the output of the inverter H01 to transition to a high state (again following the input pulse signal, POS_IN). When the trailing edge of the input pulse signal, POS_IN, arrives, the transistor M00 turns OFF and diverts the current from current source I0 into capacitor C0, thereby charging up the capacitor at node A. Once the voltage on the capacitor C0 reaches the trip point of the inverter H01, shown as a time delay of $t_{TE}$ in the timing diagram of FIG. 14A, the inverter H01 switches its output state (voltage), thereby causing a transition of the trailing edge of the pulse POS_IN by the time delay, $t_{TE}$. A person skilled in the art would clearly understand that the time delay $t_{TE}$ is determined by the ratio of the capacitor C0 to the current I0, and the trip point of the inverter H01. Accordingly, as shown in FIG. 14A, the output pulse, POS_IN$_{TE}$ maintains the polarity of the input pulse, POS_IN, and is lengthened with respect to the input pulse, POS_IN, by the time delay $t_{TE}$ induced in its trailing edge.

As can be seen in FIG. 14B, the leading (falling) edge of the negative pulse signal, NEG_IN, turns OFF the transistor M00 and diverts the current from current source I0 into capacitor C0, thereby charging up the capacitor at node A. Once the voltage on the capacitor C0 reaches the trip point of the inverter H01, shown as a time delay of $t_{LE}$ in the timing diagram of FIG. 14B, the inverter H01 switches its output state (voltage), thereby causing a transition of the leading edge of the pulse NEG_IN by the time delay, $t_{LE}$. A person skilled in the art would clearly understand that the time delay $t_{LE}$ is determined by the ratio of the capacitor C0 to the current I0, and the trip point of the inverter H01. Once the trailing (rising) edge of the pulse NEG_IN arrives, the transistor M00 is turned ON, thereby shorting out the capacitor C0 and sinking the current from current source I0. This forces the remaining circuitry to pass the trailing edge without any extra delay as shown in the timing diagram of FIG. 14B. Accordingly, as shown in FIG. 14B, the output pulse, NEG_IN$_{LE}$ maintains the polarity of the input pulse, NEG_IN, and is shortened with respect to the input pulse, NEG_IN, by the time delay $t_{LE}$ induced in its leading edge.

With further reference to the basic edge delay circuit (1410), it is pointed out that the operating conditions (e.g., threshold voltage and temperature sensitivity) of the transistors of the current source I0 and the transistor M00 should track the transistors of the inverter H01 to ensure proper timing control. A person skilled in the art would appreciate that the basic edge delay circuit (1410) according to the present teachings comprises only high speed circuit elements including transistors, inverters, and capacitors, and is devoid of any series resistors that may negatively affect performance (e.g., speed). Dead time controllers as known in the art rely on operational amplifiers or comparators, which are slow, induce extra delays, and exhibit low slew rates (aka long transition times) as compared to an inverter. By using the basic edge delay circuit (1410) for generating the timing adjusted signals DT_HX and DT_LX (e.g., per FIG. 13), high slew rate transitions leading to accurate delays in the leading and trailing edges can be provided, both of which are important characteristics as discussed below.

Figure 15A:
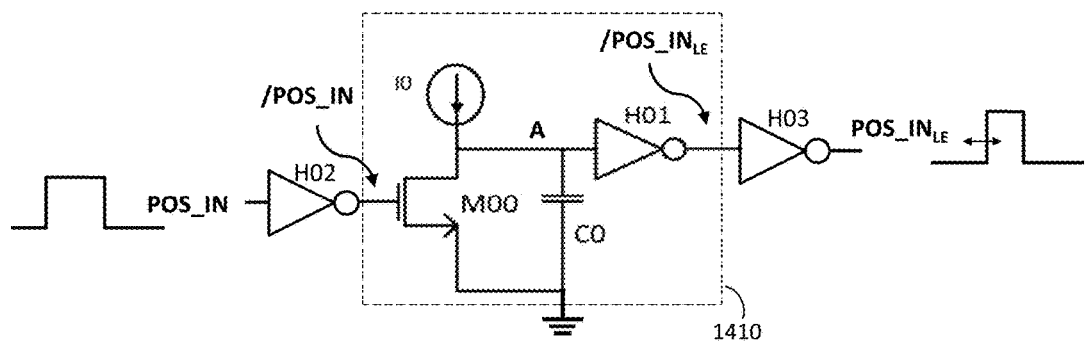
FIGS. 15A and 15B show coupling of one or more inverters to an input and/or output of the basic edge delay circuit of FIGS. 14A and 14B.
Figure 15A:
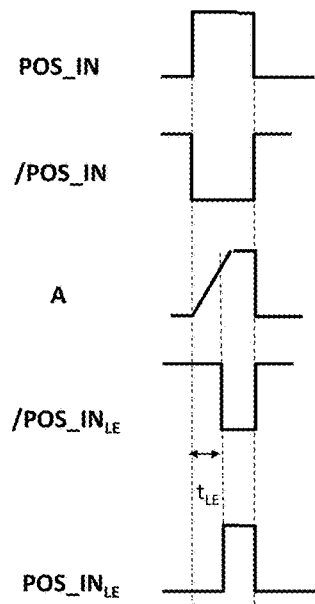
Figure 15B:
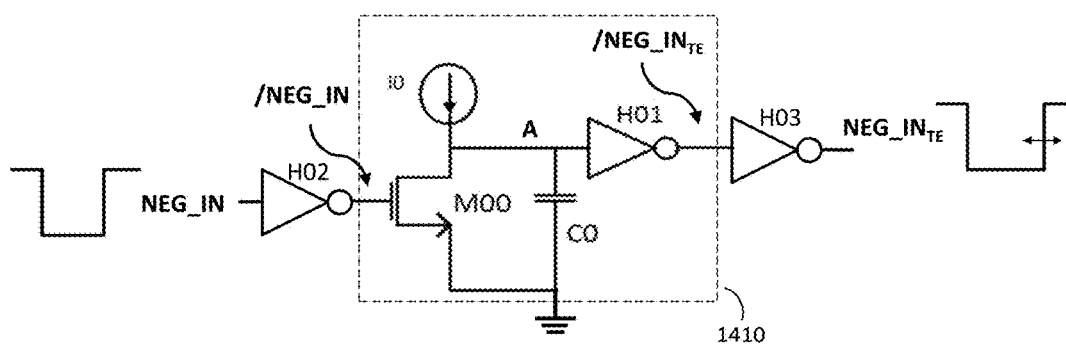
Figure 15B:
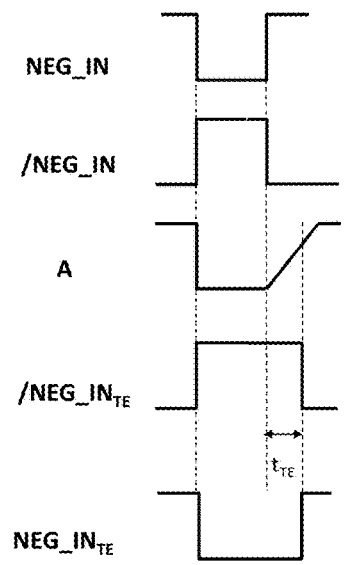

FIG. 15A and FIG. 15B show that coupling of one or more inverters to an input and/or output of the basic edge delay circuit (1410) can provide further flexibility to the basic edge delay circuit (1410), and not restricting operation to leading edge delay for a negative input pulse signal, trailing edge delay for a positive input pulse signal, and same polarity of input and output pulses.

For example, as shown in the combined circuit of FIG. 15A, a leading edge delay of a positive input pulse signal, POS_IN, can be obtained by reversing the positive polarity of the input signal via an inverter H02 coupled to the input of the basic edge delay circuit (1410). As shown in FIG. 15A, the inverter H02 reverses the positive polarity of the input signal, POS_IN, by generating, therefrom, a negative pulse signal, /POS_IN, that is the inverted version of the positive input pulse signal, POS_IN. Accordingly, the basic edge delay circuit (1410) delays the leading edge of the inverted signal, /POS_IN, which corresponds to the leading edge of the positive input pulse signal, POS_IN, as shown in the timing diagram of FIG. 15A (based on the timing diagram of FIG. 14B). If desired, an inverter H03 coupled to the output of the basic edge delay circuit (1410) can be used to restore the polarity of the positive input pulse signal, POS_IN. Accordingly, the inverter H02 allows leading edge delay of a positive input pulse signal to the basic delay circuit (1410), and the inverter H03 allows for a same positive pulse polarity at an input and output of the combined circuit.

Likewise, as can be seen in FIG. 15B and corresponding timing diagram, same combined circuit as shown in FIG. 15A can be used to provide a trailing edge delay of a negative input pulse signal, NEG_IN. It should be noted that the inverter H03 is merely used to restore polarity of the input pulse signal, and in some applications, may not be required.

Based on the above, it becomes clear to a person skilled in the art that any one of a trailing edge or a leading edge of either of positive pulse signal or a negative pulse signal can be adjusted by a combination of the basic edge delay circuit (1410) with one or more inverters coupled to its input and/or output.

As noted above, since the basic edge delay circuit (1410) preserves polarity of the input pulse signal, and since for a same input pulse polarity, same edge is delayed by the basic edge delay circuit (1410), cascading (series connecting) a plurality of such circuits (1410) results in compounding a same edge delay. However, by inserting an inverter in the front of one of the cascaded basic edge delay circuits (1410), polarity of the signal is reversed and therefore a different edge of the signal is delayed. This is shown in the exemplary dead time control circuits (1600A, 1600B) of FIGS. 16A, 16B, wherein each of the timing adjusted signals, DT_HX and DT_LX, is independently generated according to a separate processing path comprising a number of cascaded basic edge delay circuits (1410).

Figure 16A:
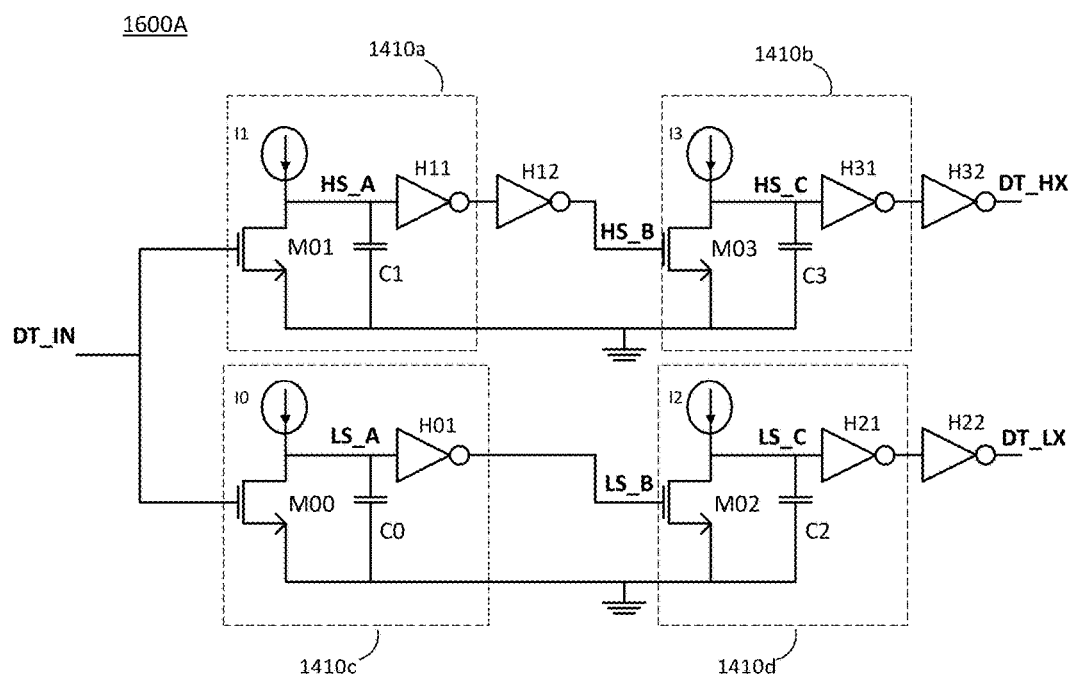
FIGS. 16A and 16B show exemplary embodiments according to the present disclosure of dead time control circuits using the basic edge delay circuit of FIGS. 14A and 14B.

With further reference to FIG. 16A, a processing path of the timing adjusted signal DT_HX comprises two series connected basic edge delay circuits (1410a, 1410b). A trailing edge of a positive pulse of the DT_IN signal can be adjusted (delayed) by the circuit (1410a) according to the description above with reference to FIG. 14A. The inverter H12 inverts the output of the circuit (1410a) and therefore reverses polarity on the signal to the circuit (1410b). In turn, the circuit (1410b) adjusts (delays) the leading edge of the positive pulse of the DT_IN signal, according to the description above with reference to FIG. 14B and FIG. 15A. The inverter H32 can be used to restore the polarity of the positive pulse of the DT_IN signal.

Figure 16B:
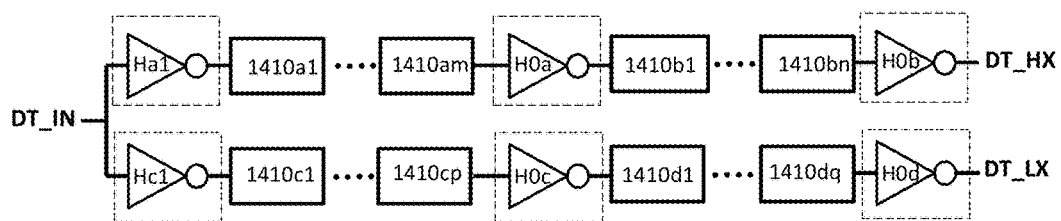

With continued reference to FIG. 16A, a processing path of the timing adjusted signal DT_LX comprises two series connected basic edge delay circuits (1410c, 1410d). A trailing edge of the positive pulse of the DT_IN signal can be adjusted (delayed) by the circuit (1410c) according to the description above with reference to FIG. 14A. Since the signal to the next circuit (1410d) is not inverted, then the circuit (1410d) can apply another delay to the same trailing edge of the positive pulse of the DT_IN signal. This can extend the amount of the trailing edge delay of the processed output signal (DT_LX) to an amount that is beyond the capability of a single basic edge delay circuit. If needed, the inverter H22 can be used to invert the output of the circuit (1410a) and therefore provide a desired polarity of the output signal, DT_LX. A person skilled in the art would clearly understand that same circuit shown in FIG. 16A can be described in terms of any of the positive pulse (a rising leading edge followed by a falling trailing edge) and negative pulse (a falling leading edge followed by a rising trailing edge) of the DT_IN signal (square wave), with same result in the output waveforms of DT_HX and DT_LX FIG. 16B shows a generic implementation (1600B) of a dead time control circuit according to an embodiment of the present disclosure, based on a cascaded combination of one or more basic edge delays circuits (1410) and one or more inverters. As can be seen in FIG. 16B, a processing path of the timing adjusted signal DT_HX comprises one or more series connected basic edge delay circuits (1410a1, . . . , 1410am) to adjust a trailing edge of a positive pulse of the DT_IN signal, and one or more series connected basic edge delay circuits (1410b1, . . . , 1410bn) which can be used to adjust a leading edge of the positive pulse of the DT_IN signal given presence of an optional inverter, H0a. Another optional inverter H0b can be used to either restore polarity of the output signal, DT_HX or switch its polarity to a desired polarity. Likewise, a processing path of the timing adjusted signal DT_LX comprises one or more series connected basic edge delay circuits (1410c1, . . . , 1410ap) to adjust a trailing edge of a positive pulse of the DT_IN signal, and one or more series connected basic edge delay circuits (1410d1, . . . , 1410dq) which can be used to adjust a leading edge of the positive pulse of the DT_IN signal given presence of an optional inverter, H0c. Another optional inverter H0d can be used to either restore polarity of the output signal, DT_LX or switch its polarity to a desired polarity. Furthermore, as shown in FIG. 16B, optional inverters Ha1, Hc1 may be used at an input of each of the two processing paths to further invert the input to each of the two processing paths, and therefore establish an order of processing of the leading and trailing edges of the input signal through the two processing paths (e.g., process with respect to negative pulses).

Figure 17A:
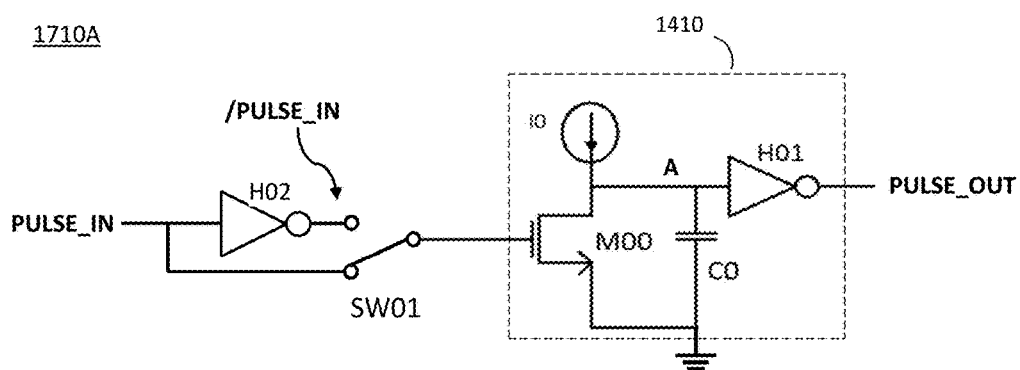
FIG. 17A shows a configurable edge delay circuit according to an embodiment of the present disclosure that is based on the basic edge delay circuit of FIGS. 14A and 14B, with added flexibility to selectively delay the leading edge or trailing edge.

FIG. 17A shows a configurable edge delay circuit (1710A) according to an embodiment of the present disclosure that is based on the basic edge delay circuit (1410) with added flexibility to selectively invert an input to the basic edge delay circuit. As can be seen in FIG. 17A, an input pulse, PULSE_IN, to the configurable edge delay circuit (1710A), and an inverted version of the input pulse, /PULSE_IN, that is inverted by way of an inverter, H02, are selectively routed to the input of the basic edge delay circuit (1410) through a switch, SW01. This in turn allows operation of the configurable edge delay circuit (1710A) according to the operation of any of the configurations described above with reference to FIGS. 14A, 14B, 15A and 15B. In other words, the configurable edge delay circuit (1710) can selectively delay a leading or trailing edge of any of a positive or negative polarity pulse.

Figure 17B:
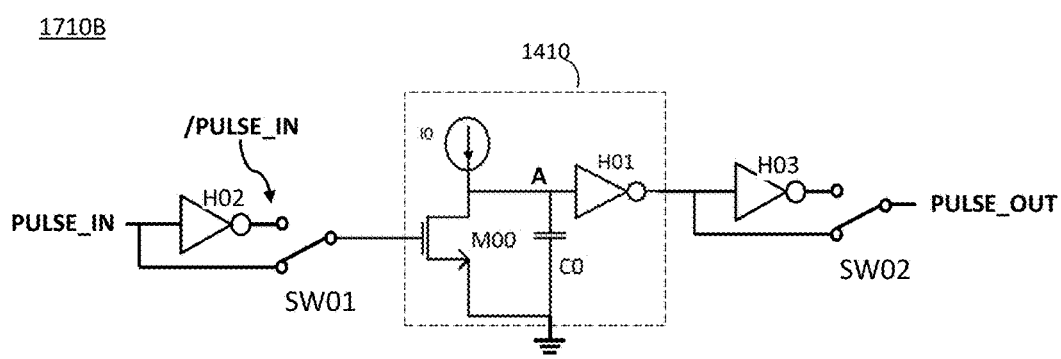
FIG. 17B shows an additional embodiment of a configurable edge delay circuit, based on the configuration shown in FIG. 17A, with added flexibility to selectively invert an output pulse.

FIG. 17B shows an alternative embodiment of a configurable edge delay circuit (1710B), based on the configuration (1710A) described above with reference to FIG. 17A, with added flexibility with respect to the configuration (1710A) of FIG. 17A to selectively invert an output pulse, PULSE_OUT, of the configurable edge delay circuit (1710B). As can be seen in FIG. 17B, the output pulse, PULSE_OUT, is selected through a switch (e.g., single-pole, double-throw), SW02, from one of an output pulse to the basic edge delay circuit (1410) and an inverted version of such output pulse that is inverted by way of an inverter, H03. The inverter H03 can be selectively used to provide operation per the inverter H03 described above with reference to FIGS. 15A and 15B. A person skilled in the art would clearly understand that the addition of the inverters H02, H03 in an edge processing path as provided in the configurations 1710A, 1710B, as well as ones described above with reference to FIGS. 15A, 15B, 16A and 16B, may introduce a slight added delay of the edges but with no effect on relative timing of two parallel processing paths (e.g., HS and LS paths).

Figure 18A:
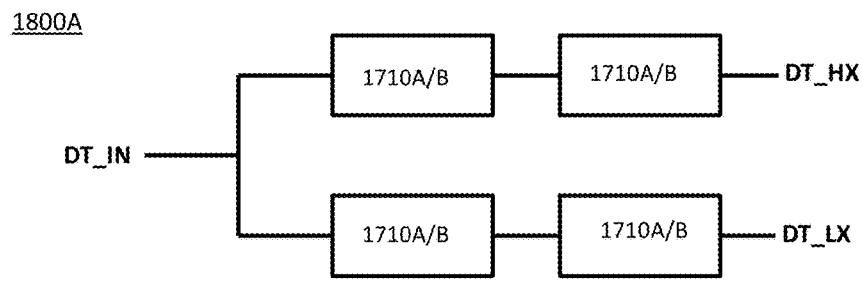
FIG. 18A shows an exemplary dead time control circuit according to an embodiment of the present disclosure based on the configurable edge delay circuits (1710A) and/or (1710B).
Figure 18B:
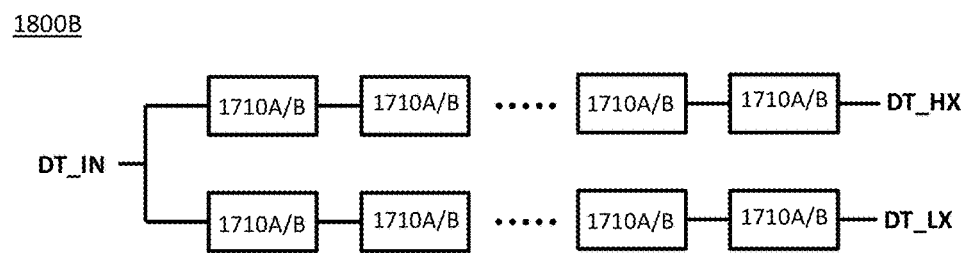
FIG. 18B shows another exemplary dead time control circuit according to an embodiment of the present disclosure based on the configurable edge delay circuits of FIGS. 17A and 17B.

FIG. 18A shows an exemplary dead time control circuit (1800A) according to an embodiment of the present disclosure based on the configurable edge delay circuits (1710A) and/or (1710B), wherein edge timing processing for each of the dead time adjusted signals DT_HX and DT_LX is based on two series connected (cascaded) circuits (1710A) or (1710B), denoted (1710A/B) in the figure. Based on the description above with reference to FIGS. 14A-17B, a person skilled in the art would appreciate flexibility in timing adjustment of the edges provided by the dead time controller (1800A). In particular, by controlling the configuration (e.g., via switches SW01 and SW02) of each of the two series connected configurable edge delay circuits (1710A/B), any of the leading and trailing edges of the input signal, DT_IN can be adjusted, and any polarity of the output adjusted signal (DT_HX, DT_LX) with respect to the polarity of the input signal can be obtained. For example, by appropriate setting of the switches (SW01, SW02) in the processing path of each of the DT_HX and DT_LX signals, the configuration (1600A) of FIG. 16A can be obtained. Other settings of the switches can allow different configurations as necessary. Furthermore, by cascading a plurality of configurable edge delay circuits (1710A/B), as shown in FIG. 18B, further delaying of any or both of the falling and rising edges beyond the capability of a single configurable edge delay circuit (1710A/B) can be provided. In particular, any configuration based on a variation of the configuration (1600B) described above with reference to FIG. 16B can be provided.

Figure 18C:
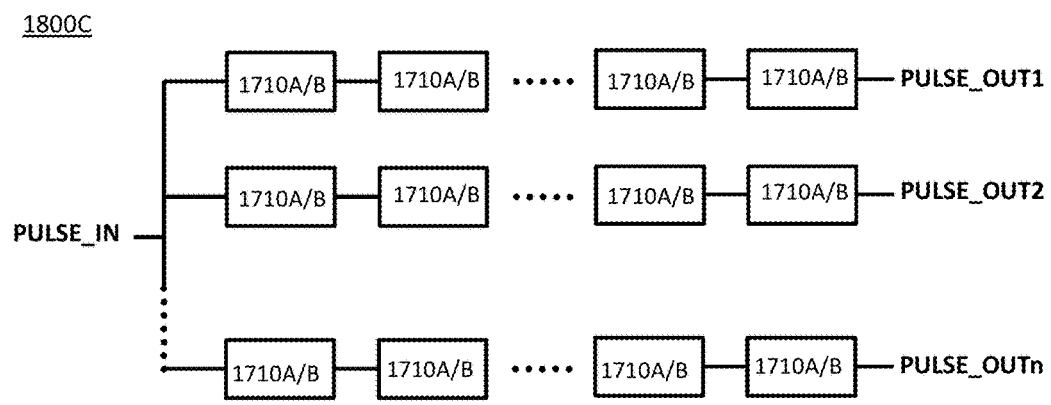
FIG. 18C shows an exemplary embodiment according to the present disclosure of an edge timing controller based on the configurable edge delay circuits of FIGS. 17A and 17B.

A person skilled in the art would clearly appreciate the flexibility in controlling of edge timing as well as signal polarity provided by the configurable edge delay circuit (1710A) and (1710B). According to an embodiment of the present disclosure, such configurable edge delay circuit can be used as a building block of an edge timing controller (1800C) shown in FIG. 18C, which can be used in any application where precise control of edges of a square wave signal is desired. Operation and configuration of such edge timing controller should be clear to a person skilled in the art based on the description above. The edge timing controller (1800C) can generate edge and polarity adjusted output signals, PULSE_OUT1, ..., PULSE_OUTn, based on a single input signal, PULSE_IN. As described above, either one or both of the falling and rising edges of each of the output signals, PULSE_OUT1, ..., PULSE_OUTn, as well as respective polarities with respect to the input signal, PULSE_IN, can be adjusted independently.

It is pointed out that any dead time control circuit according to the present teachings must ensure that, as shown, for example, in FIG. 12A, the HS and LS outputs are of inverted polarity, ensuring that HS and LS devices T1, T2, are not intentionally on at the same time. In addition, all four edges (HS rising, HS falling, LS rising and LS falling) can be delayed by adjusting the size of each of the current sources (e.g., I0 of FIGS. 14A, 14B), each of which may be of any value (i.e., any of the current sources may be of separate magnitudes). This allows for ensuring the different timing signals can be adjusted relative to each other, and specifically they can be adjusted to increase or decrease the relative timing between them.

For example, HS rising edge can be delayed relative to LS falling edge to ensure no timing overlap, causing so-called shoot through current, which wastes power and can damage other devices. Since timing at the final stages of an overall system can be affected by factors beyond the dead time control circuitry, such as circuit board delays or even connectors between boards, it may be necessary to cause a HS signal to overlap a LS signal at the output of the dead time controller in order to compensate other system delays. Being able to adjust timing of all four edges, and to create either positive or negative overlap of paired edges is a unique capability of the current invention.

With reference back to the basic edge delay circuit (1410) shown in FIGS. 14A and 14B, according to an exemplary embodiment of the present disclosure, timing adjustment (e.g., delay) of an edge can be achieved by setting the value (magnitude) of the current source I0 either with on-chip or off-chip components. For example, a current mirrored current source (current DAC) can be a programmable way to adjust the current source I0. In such an example, digital programming, potentially including fuses, may be used to program the current DAC. An advantage of this approach is provision of a programmable timing adjustment based on components that can be entirely found on the same chip along with the dead time control circuit. Setting of the value of the current source can be provided via the control signals, CNTL, as shown in the above described FIG. 11.

According to an embodiment of the present disclosure, a magnitude of the current source I0 of the basic edge delay circuit (1410) can also be changed by adjusting an off-chip component such as a resistor (e.g., resistor R of FIG. 19 later described). In such a case, the resistor value can be chosen for a given application and changed during circuit board assembly. An advantage of this approach is to avoid the need for on-chip programming and it is typically a very inexpensive and accurate solution.

According to a further embodiment of the present disclosure, timing adjustment can also be achieved by replacing the on-chip capacitor C00 of the basic edge delay circuit (1410), shown as a fixed capacitor in FIGS. 14A and 14B, with digitally tunable capacitors, again offering on-chip solutions with programmability. Alternatively, the capacitor C00 can be off-chip and be adjusted on the circuit board level, just as for the current source resistors described above. An exemplary digitally tunable capacitor is described in the above reference U.S. Pat. No. 9,024,700 B2, the disclosure of which is incorporated herein by reference in its entirety.

According to a further embodiment of the present disclosure, timing adjustment of a dead time controller (1400A, 1400B, 1600A, 1600B), or an edge timing controller (1800C), described above, can be provided by incremental adjustment of the edges based on a plurality of cascaded basic edge delay circuits (1410) and/or configurable edge delay circuits (1710A, 1710B), where each such circuit can perform a same or different timing adjustment. For example, coarse and fine adjustments can be provided according to a weighing scheme of the timing adjustments provided by each of the delay circuits (1410, 1710A, 1710B), where individual timing adjustments can be provided by way of any of the methods discussed above (e.g., resistor, capacitor, current source).

A person skilled in the art would clearly appreciate the numerous advantages provided by the edge delay circuits according to the present teachings, including:

Efficiency: With very sharp rise and fall times, thanks to use of inverters rather than comparators or op amps, ON and OFF timing can be adjusted to very fine accuracy. Additionally, accurate elimination of shoot through current also improves efficiency;

Low distortion: Accurate timing control at the final output, for example a class D amplifier, ensures accurate, undistorted reproduction of the output drive signal as intended by the input signal;

High speed: High speed edges, again thanks to elimination of op amps and comparators, enables high speed control which in turn enables very short output pulses. This can enable high speed pulsed inputs as well as very short pulses;

Flexibility: All timing edges can be adjusted, creating both positive and negative overlap of HS and LS signals. These edges can be adjusted with either on-chip programmability or off-chip component placement. Various applications will benefit from these programming and adjustments options and a single chip can be used for (ie, programmed for) multiple different applications, saving inventory and purchasing costs;

Reliability: With accurate timing control and reduction of shoot-through currents, output devices will operate at lower risk of damage. Additionally, increased efficiency reduces operating temperatures, thereby improving reliability; and Low cost: Flexibility, reliability, efficiency and single chip implementation with off-chip component options all contribute to lower cost.

As known to a person skilled in the art, and discussed above, a trip point associated with an inverter, such as the inverter used in any of the embodiment described above with reference to FIGS. 14A-18C, the inverter trip point, can change with a process (P) used to fabricate the inverter, as well as with a voltage (V) applied to the inverter (e.g. biasing, supply) and an operating temperature (T) of the inverter. Such "PVT" characteristics of the inverter can therefore affect operation of the edge delay circuits represented in FIGS. 14A-18C. It follows that according to an embodiment of the present disclosure, the current source I0 has an output current that is proportional to the trip point of the inverter (e.g., H01, H02, H03). It can be assumed that given a same fabrication process of such inverters, corresponding trip points remain the same as a function of the PVT, since such inverters see a same bias/supply voltage (e.g. Vdd1) and are placed in a very close physical proximity of each other and therefore subjected to a same local temperature.

Figure 19:
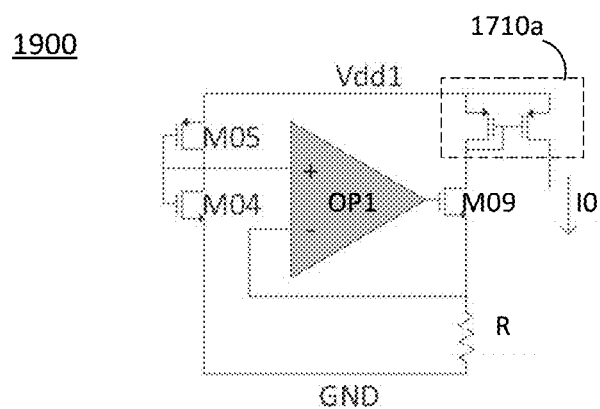
FIG. 19 shows a current source circuit with compensated current with respect to process, voltage and temperature variations.

FIG. 19 shows a current source circuit 1900 according to a further embodiment of the present disclosure which can be used as the current source I0, and provide a current to the edge delay circuit according to the present teachings that is compensated with respect to the PVT that causes a drift of the trip point of the inverter circuits (H01-H03).

In FIG. 19, an exemplary circuit is shown that ensures that the current source I0 is proportional to the inverter trip point, causing the impact of a variable trip point on time delay, as described above, to be cancelled by the proportionally adjusted amount of current in current source I0. The exemplary circuit represented in FIG. 19 achieves this by using a current mirror circuit (1710a) (comprising a reference current leg series connected with transistor M09, and one output mirrored leg I0) which mirrors a current going through the transistor M09 and a resistor, R which can be an external resistor to the circuit (1900). A person skilled in the art will realize that such current is equal to Vtrip of the inverter formed by M04 and M05 divided by the resistor, R. As the inverter (M04, M05) is representative of the inverters (H01-H03) used in the exemplary edge delay circuits according to the present teachings, its trip point varies similarly to (tracks) the trip point of such inverters.

More specifically, it is commonly known that the biased inverter shown in FIG. 19 formed by the transistors M04 and M05 and connecting the common drain node of the transistors to the common gate node of the transistors, operates at its trip point (as inverter is biased at or close to its trip point voltage), latter trip point voltage being proportional to PVT as described above. This voltage serves as a reference voltage for the operational amplifier OP1 which takes its driven voltage from the voltage on the external resistor, R. Due to this feedback, the operational amplifier OP1 forces the voltage on the resistor R to track the inverter (M4, M5) trip point voltage, and thereby forces the current through the resistor to track the PVT. The known current mirror (1710a) depicted in FIG. 19 forces the current I0 to match the current through the resistor R and thereby forces current I0 to track the PVT.

The person skilled in the art readily understands that the various teachings of the present disclosure can apply to multiple semiconductor materials and device structures. For simplicity, the embodiments and examples presented herein for illustrative purposes include only GaN FETs as the high voltage devices controlled by the gate driver circuit (e.g. HS level shifter) according to the various embodiments of the present disclosure, and SOI MOSFETs for the low voltage control devices used in the gate driver circuit (e.g. HS level shifter). The person skilled in the art can use the teachings according to the various embodiments of the present disclosure to derive level shifters and controls using other types of low voltage transistors (e.g. non SOI MOSFETs) and for interfacing with other types of high voltage transistors (e.g. non GaN FETs).

As mentioned in the prior sections of the present disclosure, the level shifter (e.g. HS level shifter (425)) according to the various presented embodiments, as well as the gate driver circuit (410), can be manufactured, either in its entirety or partially, in an integrated circuit based on various technologies, and in particular in CMOS or SOI CMOS. Again, as mentioned above, CMOS technologies, whether bulk Si or SOI, have high level of integration, ease of manufacturing and an associated low cost. Furthermore, and as previously noted, low voltage (e.g. standard CMOS) transistors can have speed and performance which can drive GaN circuits (e.g. comprising high voltage GaN FET transistors) in a manner that benefits from the low FOM of GaN transistors.

However, while no transistor in the current level shifter (e.g. HS level shifter (425)) withstands a high voltage across the transistor (e.g. across its drain and source), the overall circuit as described above (e.g. level shifter) floats to high voltage (e.g. with voltage at node SW) and therefore the entire circuit is isolated from GND and withstands the high voltage drop from $V_{IN}$ to GND.

Figure 20A:
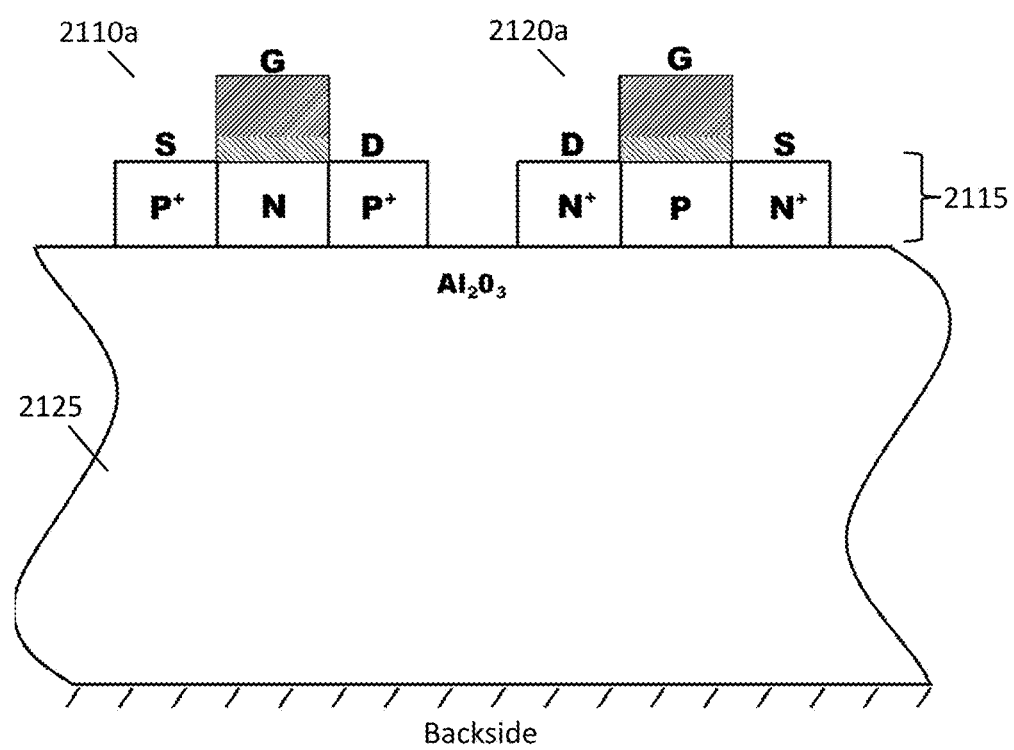
FIGS. 20A, 20B and 20C show different low voltage transistor structures which can be used in the various embodiments of the HS level shifter according to the present disclosure.
Figure 20B:
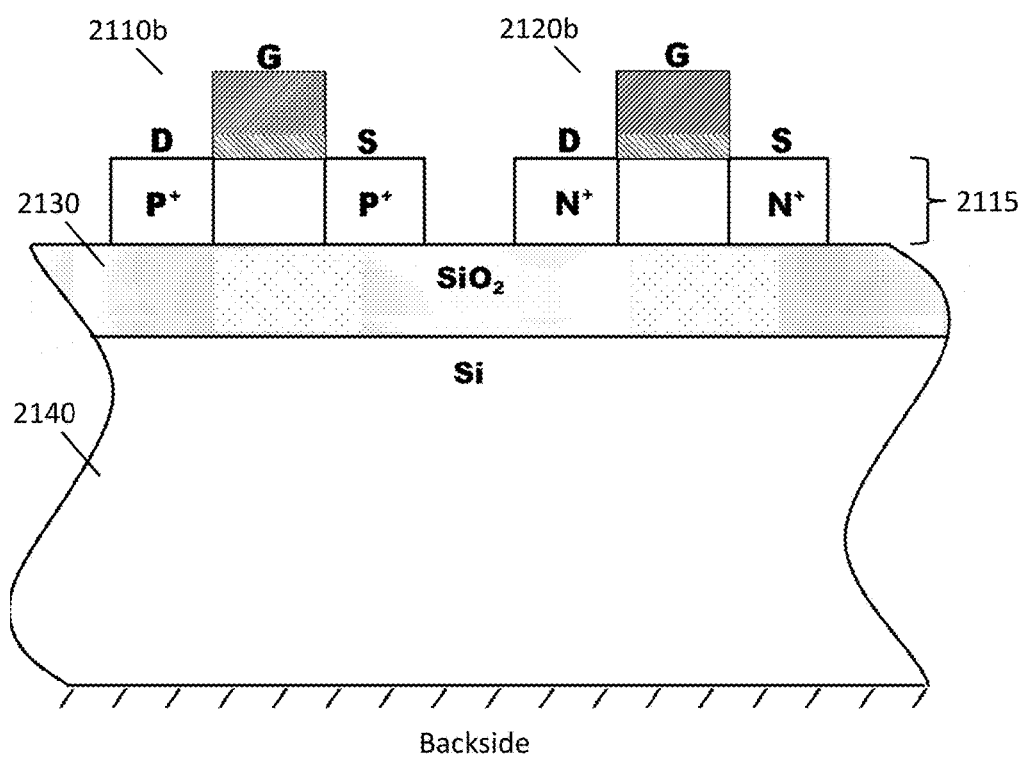
Figure 20C:
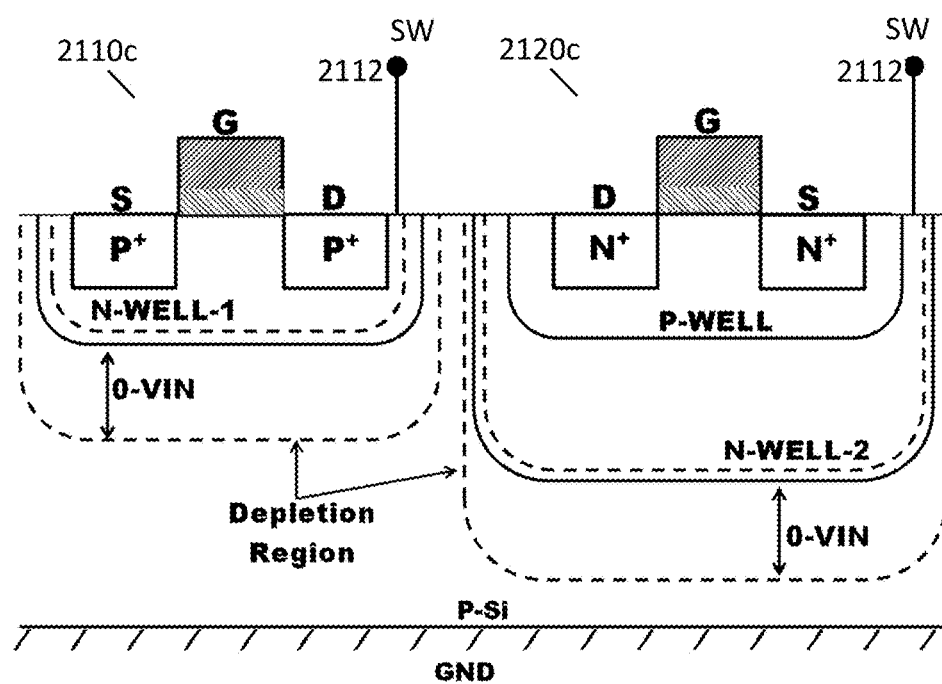

FIGS. 20A, 20B and 20C depict cross sections of the three main CMOS semiconductor technologies, listed above, specifically, SOS, SOI and bulk Si, respectively. A person skilled in the art readily recognizes that each of such cross sections shows a single P and a single N type transistor, and that only the very basic features of the transistors are shown, e.g. their source, S; their drain, D; and their gate, G.

The cross section depictions in FIGS. 20A, 20B and 20C of the two transistor types can be understood by a person skilled in the art to represent any array of transistor circuitry. In each version of CMOS shown, the transistors, both P and N types, are low voltage transistors as used in the level shifter (e.g. HS level shifter 425) of the present disclosure, e.g., they are capable of handling low source-drain voltages of only, for example, 5 Volts, or less.

FIG. 20A shows an exemplary silicon on sapphire (SOS) structure comprising two low voltage transistor devices (2110a, P type) and (2120a, N type) each comprising a gate terminal (G), a drain terminal (D) and a source terminal (S), whose P+ and N+ drain and source regions are formed within a thin Si layer (2115) fabricated atop a sapphire (Al₂O₃) substrate (2125). While the low voltage transistors (2110a) and (2110b) in FIG. 11A can only withstand low voltage, say up to 5V (between any two S, D, G terminals), an entire transistor circuit of the SOS structure depicted in FIG. 20A can float from 0-$V_{IN}$ volts with respect to GND. According to an embodiment of the present disclosure, the backside of the SOS structure depicted in FIG. 20A, denoted Backside, can be connected to a DC voltage, such as 0V (GND), or left unconnected (floating). In the case of the level shifter (e.g. HS level shifter (425,) according to the present teachings, the reference voltage for the level shifter circuitry (e.g. high side) is at Vss level (e.g. tied at common node SW), which is either 0 V (e.g. when the LS GaN FET T1 is ON), up to a voltage level of $V_{IN}$ (e.g. when the HS GaN FET T2 is ON). Therefore, as a person skilled in the art can recognize, the low voltage transistors (2110a) and (2110b) represented in FIG. 20A can operate at a high voltage (e.g. equal to or larger than $V_{IN}$, such as $V_{IN}$+Vdd2 as depicted in FIG. 4) with respect to GND without ever having to handle any high voltage being impressed across them (e.g. across a corresponding source and drain). Instead, the sapphire substrate has the high voltage drop (e.g. $V_{IN}$+Vdd2) across its entire thickness. In a typical embodiment, the sapphire substrate (2125) may be 10's to 100's of micrometers thick and therefore the electric field created by such high voltage is well below the well-known dielectric strength of the sapphire.

FIG. 20B shows an exemplary silicon on insulator (SOI) transistor structure comprising two low voltage transistor devices (2110b, P type) and (2120b, N type), each comprising a gate terminal (G), a drain terminal (D) and a source terminal (S), in which a thin Si layer (2115), which comprises the P+ and N+ source and drain regions of the P type and N type transistors, is formed on a buried silicon dioxide layer (2130), thence on a Si substrate (2140). As in the case of the SOS structure of FIG. 20A, while the low voltage transistors (2110b) and (2120b) of the structure depicted in FIG. 20B can only withstand up to, say, 5V (between any two S, D, G terminals), the entire transistor structure can float from 0-$V_{IN}$ volts with respect to GND. According to an embodiment of the present disclosure, the backside of the SOI structure depicted in FIG. 20B, denoted Backside, can be connected to a DC voltage, such as 0V (GND), or left unconnected (floating). In the case of the level shifter (e.g. HS level shifter (425) according to the present teachings, the reference voltage for the level shifter circuitry (e.g. high side) is at $V_{SS}$ voltage level, which is either 0 V (e.g. when the LS GaN FET T1 is ON) up to a voltage level of $V_{IN}$ (e.g. when the HS GaN FET T2 is ON). Therefore, as a person skilled in the art can recognize, the low voltage transistors (2110b) and (2120b) represented in FIG. 20B can operate at a high voltage (e.g. equal to or larger than $V_{IN}$, such as $V_{IN}$+Vdd2 as depicted in FIG. 4) with respect to GND without ever having that high voltage impressed across them (i.e. across any two constituent terminals S, D, G). Instead, the buried silicon dioxide layer has the high voltage drop across its thickness. Such buried silicon dioxide layer is clearly much thinner than the sapphire substrate in the SOS embodiment shown in FIG. 20A.

In a typical SOI embodiment, the Si layer (2115) and the buried silicon dioxide layer (2130) can typically be 0.1-1.0 micrometers in thickness and the Si substrate (2140) underneath the Si layer (2115) and the buried silicon dioxide layer (2130) can typically be 10's to 100's of micrometers thick. Therefore, the electric field inside the buried silicon dioxide layer (2130) can typically be higher than in the sapphire substrate case depicted in FIG. 20A (since typically the sapphire substrate is much thicker than the silicon dioxide layer and can therefore withstand a much higher $V_{IN}$ voltage). In a properly designed embodiment, the buried silicon dioxide layer (2130) is thick enough to withstand a maximum electric field associated to a voltage $V_{IN}$ plus any noise spikes that may be impressed on the VIM voltage, applied to the GND plane of the Si substrate (2140). It should be noted that being able to withstand large electric field is not the only issue for the thin silicon dioxide layer. The bottom Si layer along with the thin silicon dioxide layer can create a back-gate to both the NMOS and PMOS transistors. When both NMOS and PMOS transistors fly to a high voltage such as 100V, the back-gate of the PMOS device would turn ON, similar to how the top gate turns ON the channel of the PMOS through the gate oxide. The NMOS in this case is not affected, but the PMOS in this case cannot be shut off. The threshold voltage of this back gate is typically higher than that of the top gate by roughly the ratio of the thickness of the buried silicon diode layer to the thickness of the gate oxide. Some counter measures to such back gate effect may be the introduction of S-Contacts in the SOI transistor structure of FIG. 20B as described, for example, in the above referenced U.S. patent application Ser. Nos. 14/964,412 and 15/488,367, the disclosures of which are incorporated herein by reference in their entirety.

FIG. 20C shows an exemplary bulk Si transistor structure comprising two low voltage transistor devices (2110c, P type) and (2120c, N type), each comprising a gate terminal (G), a drain terminal (D) and a source terminal (S). A person skilled in the art readily knows that such structure is at least semiconductive throughout its entire thickness. Since Si is a good conductor relative to insulators such as silicon dioxide or sapphire, the high voltage $V_{IN}$ must be dropped across corresponding reverse-biased diodes of such bulk Si structure that have high enough stand-off voltage to provide isolation to the grounded Si substrate. In the exemplary structure depicted in FIG. 20C, the high voltage, $V_{IN}$, is dropped across the diode formed by the bottom N-wells (N-WELL-1 and N-WELL-2) and the p-type substrate. This is shown in FIG. 20C for the typical case where $V_{IN}$ is positive, where N-WELL1 and N-WELL2 are connected, via an associated terminal (2112), to node SW which swings form 0 (GND) to $V_{IN}$. The person skilled in the art readily knows that for the case where $V_{IN}$ is negative, polarities of the structures shown in FIG. 20C can be reversed (e.g. all P structures to N structures and vice versa, including reversal of the p-Si substrate to n-Si substrate) in order to allow the bulk p-Si substrate, which is grounded on its back side (e.g. connected to GND), to handle a large negative voltage drop ($V_{IN}$<0V). In such case where $V_{IN}$ is negative, node SW can be connected to P-WELLS provided within the n-Si substrate (connection not shown in FIG. 20C). The person skilled in the art readily knows that other well structures can be used in a Si structure as long as such wells can provide high voltage handling capability equal to or larger than $V_{IN}$ (e.g., $V_{IN}$+Vdd2 as depicted in FIG. 4). Again, while the low voltage transistors in the structure depicted in FIG. 20C can only withstand up to, for example, 5V, the N-wells can float from 0-$V_{IN}$ volts with respect to GND. It should be noted that the various structures and wells depicted in FIG. 20C are not to scale, including the horizontal spacing between the two N-wells which must be large enough to provide lateral isolation between the wells.

Unlike insulators such as silicon dioxide or sapphire, diodes in bulk Si structures can block current only in one direction, therefore as described above, the exemplary transistor structure depicted in FIG. 20C used in a level shifter (e.g. HS level shifter (425) according to the various embodiments of the present disclosure can work for cases where $V_{IN}$ >0V (=GND), or, by using an alternate wells structure (e.g. reverse polarity structures), for cases where $V_{IN}$<0V. The insulator-based transistor structures depicted in FIGS. 20A and 20B can handle both positive and negative values of $V_{IN}$, and can therefore be used in a level shifter according to the various embodiments of the present disclosure where $V_{IN}$ takes either or both positive and negative values. Since bulk Si structures can be cheaper, however, it is valuable to note that while the insulator-based solutions may have superior performance or flexibility, the bulk Si solution may have reduced cost.

Figure 21:
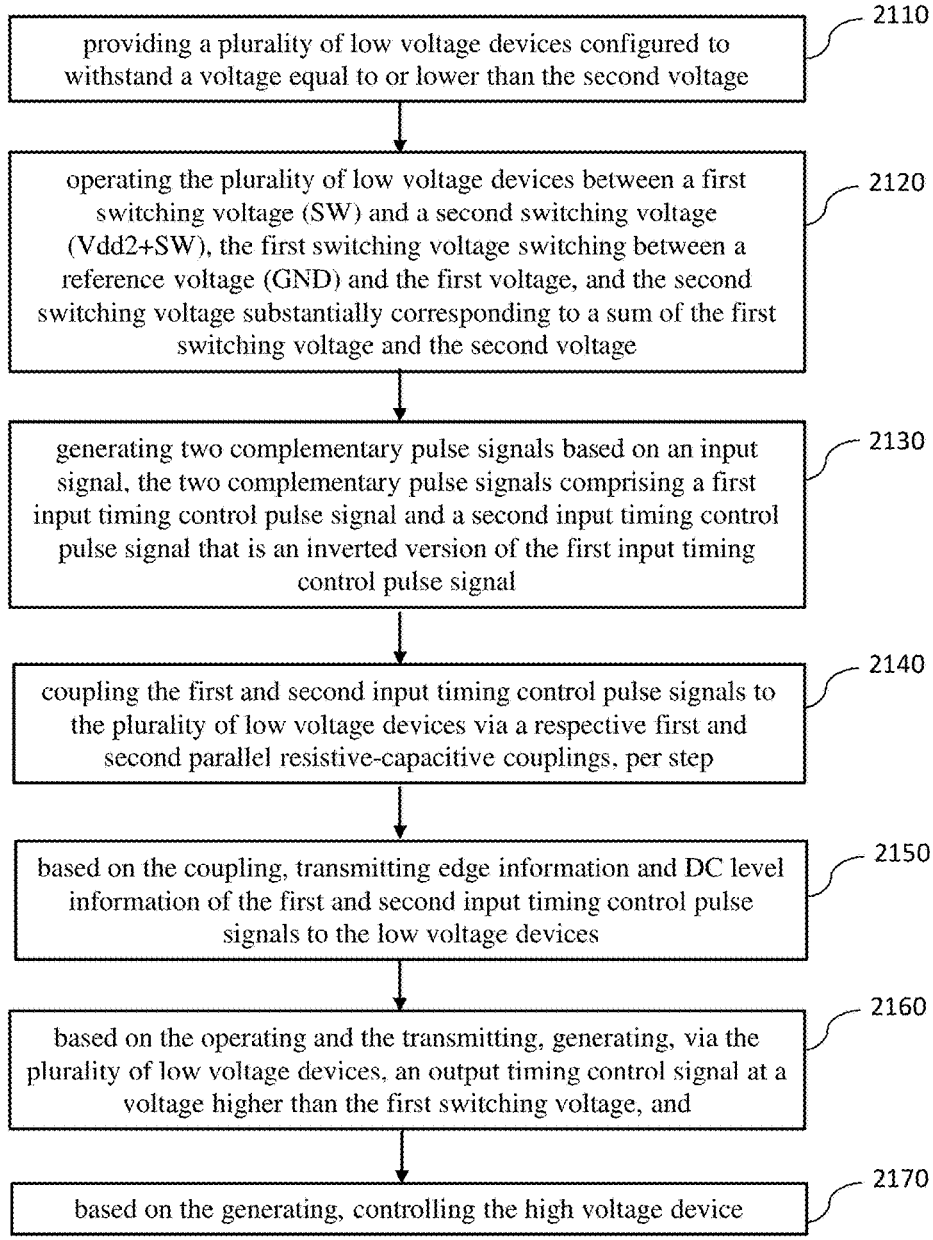
FIG. 21 is a process chart showing various steps of a method for controlling a high voltage device capable of withstanding a voltage higher than a first voltage with low voltage devices capable of withstanding a voltage equal to or lower than a second voltage, the first voltage being substantially higher than the second voltage, according to an embodiment of the present disclosure.

FIG. 21 is a process chart (2100) showing various steps of a method for controlling a high voltage device capable of withstanding a voltage higher than a first voltage with low voltage devices capable of withstanding a voltage equal to or lower than a second voltage, the first voltage being substantially higher than the second voltage, according to an embodiment of the present disclosure. As can be seen in the process chart (2100), the method comprises: providing a plurality of low voltage devices configured to withstand a voltage equal to or lower than the second voltage, per step (2110); operating the plurality of low voltage devices between a first switching voltage (SW) and a second switching voltage (Vdd2+SW), the first switching voltage switching between a reference voltage (GND) and the first voltage, and the second switching voltage substantially corresponding to a sum of the first switching voltage and the second voltage (per step 2120); generating two complementary pulse signals based on an input signal, the two complementary pulse signals comprising a first input timing control pulse signal and a second input timing control pulse signal that is an inverted version of the first input timing control pulse signal, per step (2130); coupling the first and second input timing control pulse signals to the plurality of low voltage devices via a respective first and second parallel resistive-capacitive couplings, per step (2140); based on the coupling, transmitting edge information and DC level information of the first and second input timing control pulse signals to the low voltage devices, per step (2150); based on the operating and the transmitting, generating, via the plurality of low voltage devices, an output timing control signal at a voltage higher than the first switching voltage, per step (2160); and based on the generating, controlling the high voltage device, per the last step (2170).

With this semiconductor description, an innovative apparatus for biasing and driving high voltage semiconductor devices using only low (breakdown) voltage transistors has been disclosed. Prior art shortcomings related to loss of timing information due to high voltage switching events have been addressed by way of inclusion of a parallel resistive-capacitive coupling that may pass edge information and DC level information of a pulse signal representative of timing control information for the high voltage semiconductor devices from one (static) voltage domain to a flying voltage domain. An innovative flying comparator with clamping, provided via low voltage transistors, along with logic circuit around a latch according to the present teachings creates a filter-like block that removes unwanted glitches during a switching event.

Applications that may include the novel apparatus and systems of various embodiments include electronic circuitry used in automotive, battery systems, solar power systems, high voltage audio systems, high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz).

Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A timing control circuit configured to control timing of edges of an input square wave signal, the timing control circuit comprising:
   a first processing path comprising a first plurality of a same configurable edge delay circuit arranged in series connection, the first processing path configured to selectively delay one or both of a rising edge and a falling edge of the input square wave signal; and
   a second processing path comprising a second plurality of the configurable edge delay circuit arranged in series connection, the second processing path configured to selectively delay one or both of the rising edge and the falling edge of the input square wave signal independently from the first processing path;
   wherein the configurable edge delay circuit is configured to selectively provide an edge delay to one of the rising edge and the falling edge based on an ON or OFF state of an input switch of the configurable edge delay circuit, and
   wherein the edge delay is based on a charging time of one capacitor by a current source to reach a trip point voltage of an inverter.

2. The timing control circuit according to claim 1, wherein the current source comprises control circuitry configured to adjust a magnitude of an output current of the current source based on a variation of the trip point voltage of the inverter.

3. The timing control circuit according to claim 2, wherein the variation of the trip point voltage is based on one or more of a) a fabrication process of the inverter, b) a voltage supply to the inverter and c) an operating temperature of the inverter.

4. The timing control circuit according to claim 2, wherein the magnitude of the output current is controlled by a reference resistor.

5. The timing control circuit according to claim 2, wherein the control circuitry comprises:
   an operational amplifier;
   a current mirror;
   a reference inverter with same characteristics as the inverter of the configurable edge delay circuit, the reference inverter coupled to a first input of the operational amplifier;
   a transistor, wherein a gate of the transistor is connected to an output of the operational amplifier, a source of the transistor connected to a second input of the operational amplifier, and a drain of the transistor connected to a reference current leg of the current mirror; and
   the reference resistor connected between the source of the transistor and a reference ground.

6. The timing control circuit according to claim 5, wherein the reference inverter comprises two series connected transistors, wherein gates and drains of the series connected transistors are connected to the first input of the operational amplifier.

7. The timing control circuit according to claim 1, wherein the configurable edge delay circuit further comprises an input transistor configured to selectively receive, at a gate node of the input transistor, one of the input square wave signal and an inverted version of the input square wave signal based on the ON or OFF state of the input switch.

8. The timing control circuit according to claim 7, wherein:
   a gate node of the input transistor is coupled to a common terminal of the input switch,
   a drain node of the input transistor is coupled to the current source, a first terminal of the capacitor, and an input of the inverter, and
   a source node of the input transistor and a second terminal of the capacitor are coupled to a reference ground.

9. The timing control circuit according to claim 8, wherein:
   the configurable edge delay circuit further comprises an input inverter,
   a first switching terminal of the input switch is coupled to an output of the input inverter,
   a second switching terminal of the input switch is coupled to an input of the input inverter, and
   the input of the inverter is configured to receive one of the input square wave signal and the inverted version of the input square wave signal.

10. The timing control circuit according to claim 9, wherein
   the configurable edge delay circuit further comprises an output inverter and an output switch,
   the output switch is configured to selectively output, at a common terminal of the output switch, one of a signal at an output of the inverter and an inverted version of said signal at an output of the output inverter, based on an ON and OFF state of the output switch that is independent of the ON and OFF state of the input switch.

11. The timing control circuit according to claim 10, wherein
   a first switching terminal of the output switch is coupled to the output of the inverter, and a second terminal of the output switch is coupled to the output of the output inverter.

12. The timing control circuit according to claim 11, wherein the series connection of the first and second plurality of the same configurable edge delay circuit is provided via connection of the common terminal of the output switch of a first configurable edge delay circuit to the second switching terminal of the input switch of a second configurable edge delay circuit.

13. The timing control circuit according to claim 1, wherein a capacitance of the capacitor is configurable.

14. The timing control circuit according to claim 13, wherein the capacitor is a digitally tunable capacitor.

15. The timing control circuit according to claim 1, wherein for each of the first and second processing paths:
   delay of only one of the rising edge and falling edge is provided by configuring the input switch of each configurable edge delay circuit of the first and second processing paths to a same state,
   delay of both of the rising edge and falling edge is provided by configuring the input switch of at least two configurable edge delay circuits to different states.

16. The timing control circuit according to claim 1, further comprising one or more additional processing paths, each comprising a plurality of the configurable edge delay circuit arranged in series connection, each of the said additional processing paths configured to selectively delay one or both of the rising edge and the falling edge of the input square wave signal independently from any other processing path.

17. A circuital arrangement configured to provide timing information for control of a high side (HS) device and a low side (LS) device operating in a high voltage domain, the circuital arrangement comprising:
   a timing control circuit operating in a low voltage domain, configured to control timing of edges of an input square wave signal, the timing control circuit comprising:
      i) a first processing path to provide timing information of the HS device, comprising a first plurality of a same configurable edge delay circuit arranged in series connection, the first processing path configured to selectively delay one or both of a rising edge and a falling edge of the input square wave signal; and
      ii) a second processing path to provide timing information of the LS device, comprising a second plurality of the configurable edge delay circuit arranged in series connection, the second processing path configured to selectively delay one or both of the rising edge and the falling edge of the input square wave signal independently from the first processing path;
   wherein the configurable edge delay circuit is configured to selectively provide an edge delay to one of the rising edge and the falling edge based on an ON or OFF state of an input switch of the configurable edge delay circuit,
   wherein the edge delay is based on a charging time of one capacitor by a current source to reach a trip point voltage of an inverter,
   wherein all transistor devices of the timing control circuit are each configured to withstand a voltage substantially smaller than a high voltage of the high voltage domain.

18. The circuital arrangement according to claim 17, wherein the configurable edge delay circuit further comprises an input transistor configured to selectively receive, at a gate node of the input transistor, one of the input square wave signal and an inverted version of the input square wave signal based on the ON or OFF state of the input switch.

19. The circuital arrangement according to claim 18, wherein:
   a gate node of the input transistor is coupled to a common terminal of the input switch,
   a drain node of the input transistor is coupled to the current source, a first terminal of the capacitor, and an input of the inverter, and
   a source node of the input transistor and a second terminal of the capacitor are coupled to a reference ground.

20. The circuital arrangement according to claim 19, wherein:
   the configurable edge delay circuit further comprises an input inverter,
   a first switching terminal of the input switch is coupled to an output of the input inverter,
   a second switching terminal of the input switch is coupled to an input of the input inverter, and
   the input of the inverter is configured to receive one of the input square wave signal and the inverted version of the input square wave signal.

21. The circuital arrangement according to claim 20, wherein
   the configurable edge delay circuit further comprises an output inverter and an output switch,
   the output switch is configured to selectively output, at a common terminal of the output switch, one of a signal at an output of the inverter and an inverted version of said signal at an output of the output inverter, based on an ON and OFF state of the output switch that is independent of the ON and OFF state of the input switch.

22. The circuital arrangement according to claim 21, wherein
   a first switching terminal of the output switch is coupled to the output of the inverter, and
   a second terminal of the output switch is coupled to the output of the output inverter.

23. The circuital arrangement according to claim 22, wherein the series connection of the first and second plurality of the same configurable edge delay circuit is provided via connection of the common terminal of the output switch of a first configurable edge delay circuit to the second switching terminal of the input switch of a second configurable edge delay circuit.

* * * * *